US011099600B2

(12) United States Patent
Kawaguchi et al.

(10) Patent No.: US 11,099,600 B2
(45) Date of Patent: Aug. 24, 2021

(54) SEMICONDUCTOR INTEGRATED CIRCUIT AND METHOD FOR CONTROLLING SEMICONDUCTOR INTEGRATED CIRCUIT

(71) Applicant: Sony Corporation, Tokyo (JP)

(72) Inventors: Yuya Kawaguchi, Kanagawa (JP); Kazuo Kumano, Kanagawa (JP)

(73) Assignee: Sony Corporation, Tokyo (JP)

( * ) Notice: Subject to any disclaimer, the term of this patent is extended or adjusted under 35 U.S.C. 154(b) by 299 days.

(21) Appl. No.: 16/346,254

(22) PCT Filed: Sep. 15, 2017

(86) PCT No.: PCT/JP2017/033413
§ 371 (c)(1),
(2) Date: Apr. 30, 2019

(87) PCT Pub. No.: WO2018/083893
PCT Pub. Date: May 11, 2018

(65) Prior Publication Data
US 2020/0057466 A1 Feb. 20, 2020

(30) Foreign Application Priority Data
Nov. 7, 2016 (JP) .............................. JP2016-216946

(51) Int. Cl.
*G06F 1/12* (2006.01)
*H03K 5/135* (2006.01)
(Continued)

(52) U.S. Cl.
CPC .............. *G06F 1/12* (2013.01); *H03K 5/135* (2013.01); *H03K 5/153* (2013.01); *H03K 5/26* (2013.01);
(Continued)

(58) Field of Classification Search
CPC .......... G06F 1/12; H03K 5/135; H03K 5/153; H03K 5/26; H03K 19/20; H03K 21/38;
(Continued)

(56) References Cited

U.S. PATENT DOCUMENTS 6,275,550 B1 * 8/2001 Fukuda ................. H04L 7/0331
327/161
2003/0217225 A1 * 11/2003 Jang ..................... G06F 13/1689
711/105
(Continued)

FOREIGN PATENT DOCUMENTS

JP   2007-108172 A   4/2007
JP   2010-123807 A   6/2010
(Continued)

OTHER PUBLICATIONS

International Search Report and English translation thereof dated Dec. 5, 2017 in connection with International Application No. PCT/JP2017/033413.

*Primary Examiner* — Ryan Jager
(74) *Attorney, Agent, or Firm* — Wolf, Greenfield & Sacks, P.C.

(57) ABSTRACT

To improve a timing error detection accuracy in a semiconductor integrated circuit provided with storage devices operating in synchronization with a clock signal.
A delay part delays a data signal by two mutually-different delay times and outputs it as first and second delay signals. A holding part holds the first and second delay signals in synchronization with a timing signal for giving an instruction on a predetermined capture timing. A setup time detection part detects whether or not one of the first and second delay signals held within a setup-time detection period from a predetermined start timing to the predetermined capture timing has changed. A hold time detection part detects whether or not the other of the first and second delay signals (Continued)

held within a hold-time detection period from the predetermined capture timing to a predetermined end timing has changed.

14 Claims, 24 Drawing Sheets

(51) Int. Cl.
*H03K 5/153* (2006.01)
*H03K 5/26* (2006.01)
*H03K 19/20* (2006.01)
*H03K 21/38* (2006.01)
*H03K 5/00* (2006.01)

(52) U.S. Cl.
CPC .............. *H03K 19/20* (2013.01); *H03K 21/38* (2013.01); *H03K 2005/00078* (2013.01)

(58) Field of Classification Search
CPC ....... H03K 2005/00078; H03K 19/003; H03K 19/096; H01L 21/822; H01L 27/04
USPC .......................................................... 713/403
See application file for complete search history.

(56) References Cited

U.S. PATENT DOCUMENTS

| | | | |
|---|---|---|---|
| 2003/0223278 A1 | 12/2003 | Gomm et al. | |
| 2007/0080701 A1 | 4/2007 | Kim et al. | |
| 2012/0331326 A1* | 12/2012 | Gaskins | G06F 13/423 |
| | | | 713/401 |
| 2012/0331330 A1* | 12/2012 | Gaskins | G06F 5/06 |
| | | | 713/401 |
| 2014/0208149 A1* | 7/2014 | Canac | G06F 1/12 |
| | | | 713/401 |
| 2015/0042375 A1 | 2/2015 | Fuller | |

FOREIGN PATENT DOCUMENTS

| | | |
|---|---|---|
| JP | 2013-062572 A | 4/2013 |
| JP | 2016-025275 A | 2/2016 |
| WO | WO 2015/023516 A1 | 2/2015 |

* cited by examiner

FIG. 3
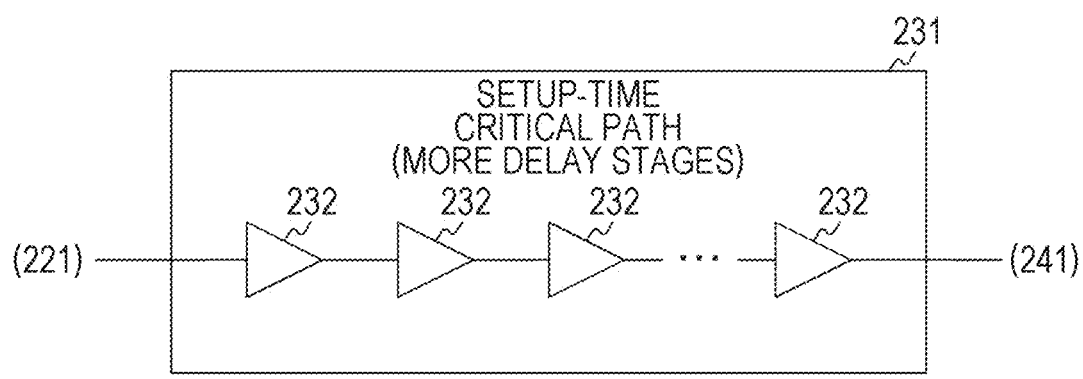
a
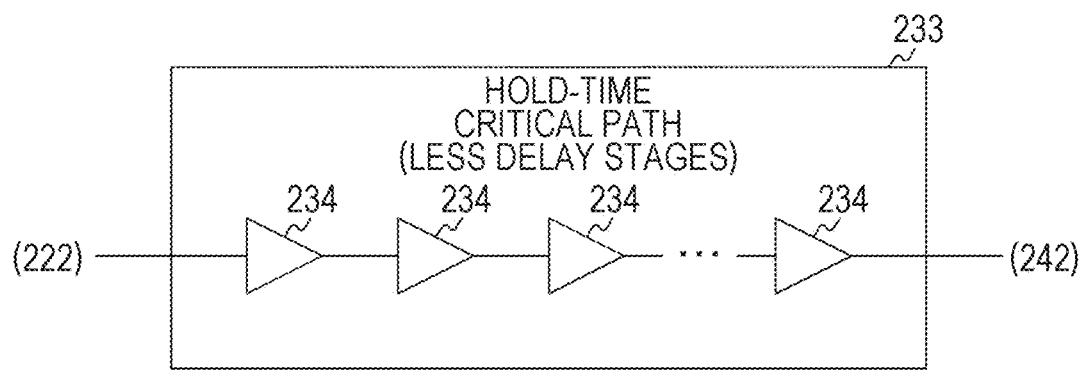
b

FIG. 4
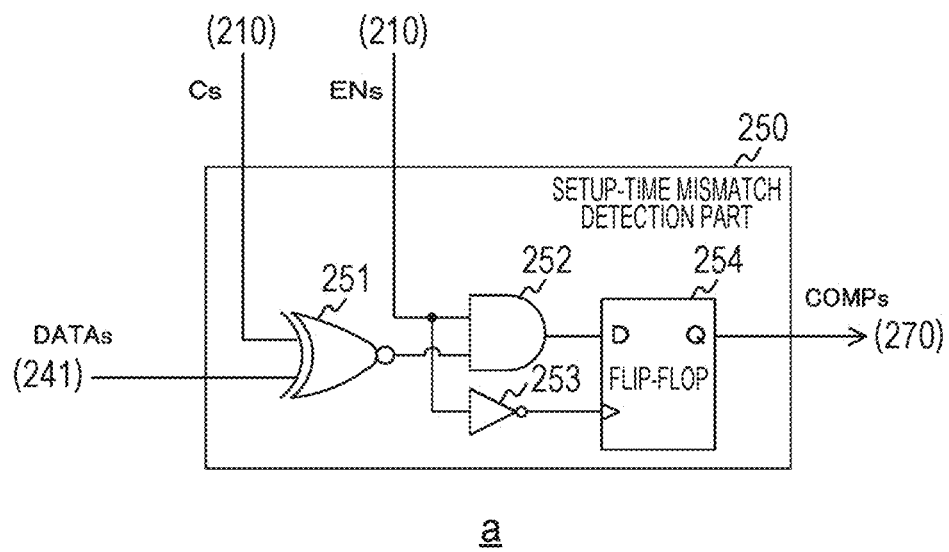
a
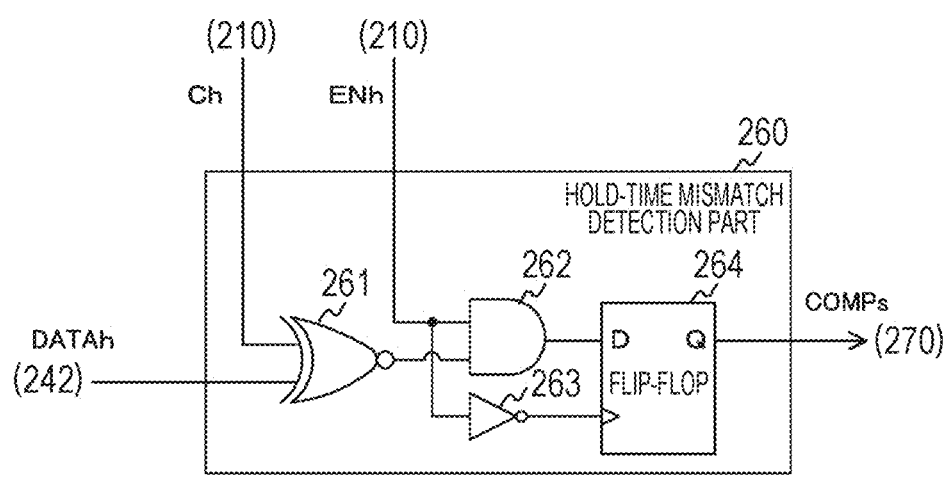
b

FIG. 15

| ALMs (SETUP-TIME) | ALMh (HOLD-TIME) | OPERATION OF ALARM TYPE DETERMINATION PART |
|---|---|---|
| 0 | 0 | — |
| 0 | 1 | OUTPUT POWER ABNORMALITY ALARM |
| 1 | 0 | OUTPUT CLOCK ABNORMALITY OR POWER ABNORMALITY ALARM |
| 1 | 1 | OUTPUT CLOCK ABNORMALITY AND POWER ABNORMALITY ALARMS |

FIG. 17

| CAUSE OF ALARM | OPERATION OF ALARM TYPE DETERMINATION PART |
|---|---|
| Dh > SET NUMBER OF STAGES AT MAXIMUM VOLTAGE | OUTPUT POWER ABNORMALITY (INCREASE) ALARM |
| Dh < SET NUMBER OF STAGES AT MINIMUM VOLTAGE | OUTPUT POWER ABNORMALITY (DECREASE) ALARM |
| SET NUMBER OF STAGES AT MINIMUM VOLTAGE ≤ Dh ≤ SET NUMBER OF STAGES AT MAXIMUM VOLTAGE AND Ds > SET NUMBER OF STAGES AT MAXIMUM VOLTAGE | OUTPUT CLOCK ABNORMALITY (LOW-SPEED) ALARM |
| SET NUMBER OF STAGES AT MINIMUM VOLTAGE ≤ Dh ≤ SET NUMBER OF STAGES AT MAXIMUM VOLTAGE AND Ds < SET NUMBER OF STAGES AT MINIMUM VOLTAGE | OUTPUT CLOCK ABNORMALITY (HIGH-SPEED) ALARM |

FIG. 21

| ERROR DETECTION RESULT | POWER ABNORMALITY DETECTION RESULT | OPERATION OF ABNORMALITY PROCESSING PART |
|---|---|---|
| 0 | 0 | — |
| 1 | 1 | DETERMINE POWER ABNORMALITY AND CONTROL POWER SUPPLY CIRCUIT |
| 1 | 0 | DETERMINE CLOCK ABNORMALITY AND CONTROL CLOCK SUPPLY PART |

SEMICONDUCTOR INTEGRATED CIRCUIT AND METHOD FOR CONTROLLING SEMICONDUCTOR INTEGRATED CIRCUIT

CROSS REFERENCE TO RELATED APPLICATIONS

This is a U.S. National Stage Application under 35 U.S.C. § 371, based on International Application No. PCT/JP2017/033413, filed Sep. 15, 2017, which claims priority to Japanese Patent Application JP 2016-216946, filed Nov. 7, 2016, each of which is hereby incorporated by reference in its entirety.

TECHNICAL FIELD

The present technology relates to a semiconductor integrated circuit, and a method for controlling the semiconductor integrated circuit. Specifically, the present technology relates to a semiconductor integrated circuit provided with storage devices operating in synchronization with a clock signal, and a method for controlling the semiconductor integrated circuit.

BACKGROUND ART

Conventionally, a semiconductor integrated circuit has been required not to violate the constraints of timings such as setup time or hold time such that a storage device such as flip-flop inside the semiconductor integrated circuit can accurately capture a data signal. Here, a setup time is a period in which a transition of a data signal is prohibited before an edge timing of a clock signal, and a hold time is a period in which a transition of a data signal is prohibited after the edge timing. When a data signal transits within the setup time or hold time, the storage device cannot normally capture the data signal, and a setup time error or a hold time error is caused.

Thus, there has been proposed a semiconductor integrated circuit for delaying a data signal by a critical path and comparing it with a non-delayed data signal thereby to detect the presence of a timing error in order to restrict an occurrence of a setup time error or the like (see Patent Document 1, for example). A delay time in which a setup time error easily occurs or a delay time in which a hold time error easily occurs can be set for a delay time of the critical path.

CITATION LIST

Patent Document

Patent Document 1: Japanese Patent Application Laid-Open No. 2010-123807

SUMMARY OF THE INVENTION

Problems to be Solved by the Invention

In the above-described conventional technology, one of a delay time in which a setup time error easily occurs and a delay time in which a hold time error easily occurs is set so that the semiconductor integrated circuit can preferentially detect one of the setup time error and the hold time error. However, the semiconductor integrated circuit prioritizes only one of the setup time error and the hold time error, and thus when the timing error which is not prioritized occurs, it can fail to be detected. For example, if the setup time error is preferentially detected in an environment in which the hold time error easily occurs, such as at so high supply voltage, the hold time error fails to be detected and the detection accuracy lowers. As escribed above, the semiconductor integrated circuit has a problem in which the timing error detection accuracy lowers.

The present technology has been made in terms of such a situation, and is directed to improving a timing error detection accuracy in a semiconductor integrated circuit provided with storage devices operating in synchronization with a clock signal.

Solutions to Problems

The present technology has been made in order to eliminate the above problems, and a first aspect thereof is a semiconductor integrated circuit including a delay part configured to delay a data signal by two mutually-different delay times and to output it as first and second delay signals, a holding part configured to hold the first and second delay signals in synchronization with a timing signal for giving an instruction on a predetermined capture timing, a setup time detection part configured to detect whether or not one of the first and second delay signals held within a setup-time detection period from a predetermined start timing to the predetermined capture timing has changed, and a hold time detection part configured to detect whether or not the other of the first and second delay signals held within a hold-time detection period from the predetermined capture timing to a predetermined end timing has changed, and a method for controlling the same. Thereby, there is obtained an effect in which whether or not a delay signal has changed within the setup-time detection period or the hold-time detection period is detected.

Further, according to the first aspect, the setup time detection part may detect whether or not the one has changed depending on whether or not a first expected value matches with the one in a setup-time detection window corresponding to the setup-time detection period, and the hold time detection part may detect whether or not the other has changed depending on whether or not a second expected value different from the first expected value matches with the other in a hold-time detection window corresponding to the hold-time detection period. Thereby, there is obtained an effect in which whether or not a delay signal matches with an expected value within the setup-time detection window or the hold-time detection window is detected.

Further, according to the first aspect, the delay part may include a first delay part configured to delay the data signal by the first delay time and to output it as the first delay signal, and a second delay part configured to delay the data signal by the second delay time and to output it as the second delay signal. Thereby, there is obtained an effect in which the first and second delay signals are output in parallel.

Further, according to the first aspect, there may be further provided a setup time error output part configured to output a setup time error in a case where the number of times the first comparison value does not match with the one exceeds a predetermined number of times, and a hold time error output part configured to output a hold time error in a case where the number of times the second comparison value does not match with the one exceeds a predetermined number of times. Thereby, there is obtained an effect in which a setup time error and a hold time error are output.

Further, according to the first aspect, there may be further provided a setup-time alarm output part configured to output a setup-time alarm in a case where the number of times the first comparison value does not match with the one exceeds a predetermined number of times, and a hold-time alarm output part configured to output a hold-time alarm in a case where the number of times the second comparison value does not match with the one exceeds a predetermined number of times. Thereby, there is obtained an effect in which a setup-time alarm and a hold-time alarm are output.

Further, according to the first aspect, there may be further provided a control part configured to sequentially perform a processing of selecting a time in a first range as the first delay time and setting it in the delay part and a processing of selecting a time in a second range different from the first range as the second delay time and setting it in the delay part. Thereby, there is obtained an effect in which a time in the first range is set as the first delay time and a time in the second range is then set as the second delay time.

Further, according to the first aspect, there may be further provided a setup time error output part configured to output a setup time error in a case where the first delay time in which a mismatch between the first comparison value and the one is detected is shorter than a first set time, and a hold time error output part configured to output a hold time error in a case where the second delay time in which a mismatch between the second comparison value and the one is detected is longer than a second set time. Thereby, there is obtained an effect in which a setup time error and a hold time error are output.

Further, according to the first aspect, there may be further provided a setup-time alarm output part configured to output a setup-time alarm in a case where the first delay time in which a mismatch between the first comparison value and the one is detected is shorter than a first set time, and a hold-time alarm output part configured to output a hold-time alarm in a case where the second delay time in which a mismatch between the second comparison value and the one is detected is longer than a second set time. Thereby, there is obtained an effect in which a setup-time alarm and a hold-time alarm are output.

Further, according to the first aspect, there may be further provided an abnormality determination part configured to, in a case where a change in either of the first and second delay signals is detected, determine which of power and the timing signal is abnormal on the basis of the detection result. Thereby, there is obtained an effect in which a determination as to which of power and the timing signal is abnormal is made.

Further, according to the first aspect, the abnormality determination part may determine which of a power abnormality due to an increase in supply voltage and a power abnormality due to a decrease in the supply voltage is caused on the basis of the first and second delay times. Thereby, there is obtained an effect in which a determination as to which of a power abnormality due to an increase in supply voltage and a power abnormality due to a decrease in the supply voltage is caused is made.

Further, according to the first aspect, the abnormality determination part may determine which of an abnormality due to an increase in speed of the timing signal and an abnormality due to a decrease in speed of the timing signal is caused on the basis of the first and second delay times. Thereby, there is obtained an effect in which a determination as to which of an abnormality due to an increase in speed of the timing signal and an abnormality due to a decrease in speed of the timing signal is caused is made.

Further, according to the first aspect, there may be further provided a power abnormality detection part configured to detect whether or not a power abnormality is caused depending on whether or not a supply voltage is within a predetermined range in a case where a change in either of the first and second delay signals is detected. Thereby, there is obtained an effect in which whether or not a power abnormality is caused is detected.

Further, according to the first aspect, the power abnormality detection part may determine whether or not the supply voltage is within the predetermined range in a case where a change in either of the first and second delay signals is detected, and may detect whether or not the power abnormality is caused depending on whether or not the number of times the supply voltage is determined as not in the predetermined range exceeds a predetermined number of times. Thereby, there is obtained an effect in which whether or not the power abnormality is caused is detected depending on whether or not the number of times the supply voltage is determined as not in the predetermined range exceeds a predetermined number of times.

Effects of the Invention

According to the present technology, it is possible to obtain an excellent effect in which a timing error detection accuracy can be improved in a semiconductor integrated circuit provided with storage devices operating in synchronization with a clock signal. Additionally, the effects described herein are not necessarily restrictive, and any effect described in the present disclosure may be obtained.

BRIEF DESCRIPTION OF DRAWINGS

FIG. 3 is a circuit diagram illustrating exemplary configurations of critical paths according to the first embodiment of the present technology.

FIG. 4 is a circuit diagram illustrating exemplary configurations of a setup-time mismatch detection part and a hold-time mismatch detection part according to the first embodiment of the present technology.

FIG. 15 is a diagram illustrating exemplary operations of an alarm type determination part according to the third embodiment of the present technology.

FIG. 17 is a diagram illustrating exemplary operations of the alarm type determination part according to the variant of the third embodiment of the present technology.

FIG. 21 is a diagram illustrating exemplary operations of the abnormality processing part according to the fourth embodiment of the present technology.

MODE FOR CARRYING OUT THE INVENTION

Modes for carrying out the present technology (denoted as embodiments below) will be described below. The description will be made in the following order.
1. First embodiment (example of detecting setup time error and hold time error)
2. Second embodiment (example of varying delay time and detecting setup time error and hold time error)
3. Third embodiment (example of detecting setup time error and hold time error and determining kind of abnormality)
4. Fourth embodiment (example of detecting setup time error and hold time error and detecting power abnormality)

1. First Embodiment

Exemplary Configuration of Semiconductor Integrated Circuit

Figure 1:
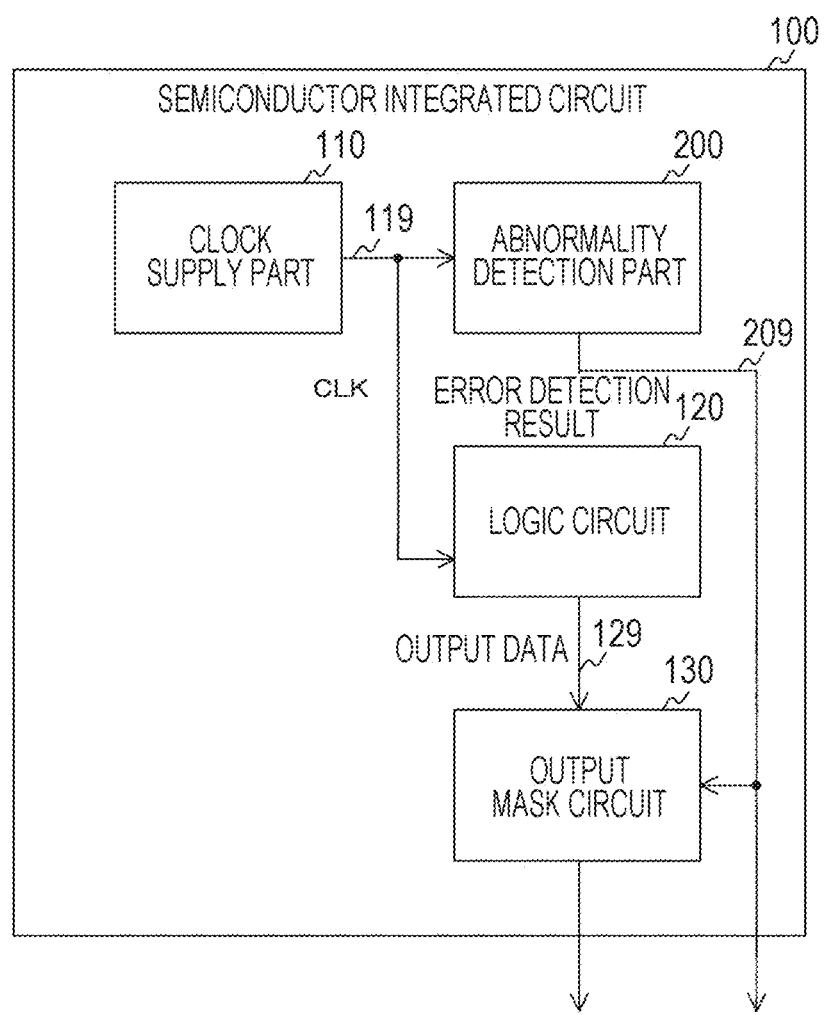
FIG. 1 is a block diagram illustrating an exemplary configuration of a semiconductor integrated circuit according to a first embodiment of the present technology.

FIG. 1 is a block diagram illustrating an exemplary configuration of a semiconductor integrated circuit 100 according to an embodiment of the present technology. The semiconductor integrated circuit 100 includes a clock supply part 110, an abnormality detection part 200, a logic circuit 120, and an output mask circuit 130. Large-scale integration (LSI) mounted on vehicle, medical device, or shooting apparatus is assumed for the semiconductor integrated circuit 100, for example.

The clock supply part 110 is directed to supplying a clock signal CLK with a predetermined frequency. An edge (such as rising edge) of the clock signal CLK indicates a timing when a storage device such as flip-flop or register captures a data signal. The clock supply part 110 generates a clock signal CLK by a crystal oscillator or a phase synchronization circuit, for example, and supplies the clock signal CLK to the abnormality detection part 200 and the logic circuit 120 via signal lines 119. Additionally, the clock supply part 110 is an exemplary timing signal supply part described in CLAIMS.

The abnormality detection part 200 is directed to monitoring the logic circuit 120 and to detecting the presence of a timing error in the logic circuit 120. The abnormality detection part 200 supplies a timing error detection result to the output mask circuit 130 and a device (such as display apparatus) outside the semiconductor integrated circuit 100 via signal lines 209.

The logic circuit 120 is directed to performing a predetermined processing in synchronization with the clock signal CLK. Image data shooting or image processing is performed in the logic circuit 120, for example. The logic circuit 120 outputs output data indicating a processing result to the output mask circuit 130 via a signal line 129.

The output mask circuit 130 is directed to masking output data when a timing error is caused. The output mask circuit 130 outputs output data to an external device in a case where a timing error is not caused. On the other hand, the output mask circuit 130 stops outputting output data (in other words, masks) in a case where a timing error is caused.

Additionally, the clock supply part 110, the abnormality detection part 200, the logic circuit 120, and the output mask circuit 130 are arranged in one semiconductor integrated circuit, but may be distributed and arranged in a plurality of circuits or devices. For example, the clock supply part 110 may be arranged outside the semiconductor integrated circuit 100.

Further, only one abnormality detection part 200 is provided, but an abnormality detection part 200 may be provided per logic circuit 120 in a case where two or more logic circuits 120 to be monitored are present. The abnormality detection parts 200 are arranged at a plurality of positions, thereby improving completeness of situation analysis inside the semiconductor integrated circuit 100.

Exemplary Configuration of Abnormality Detection Part

Figure 2:
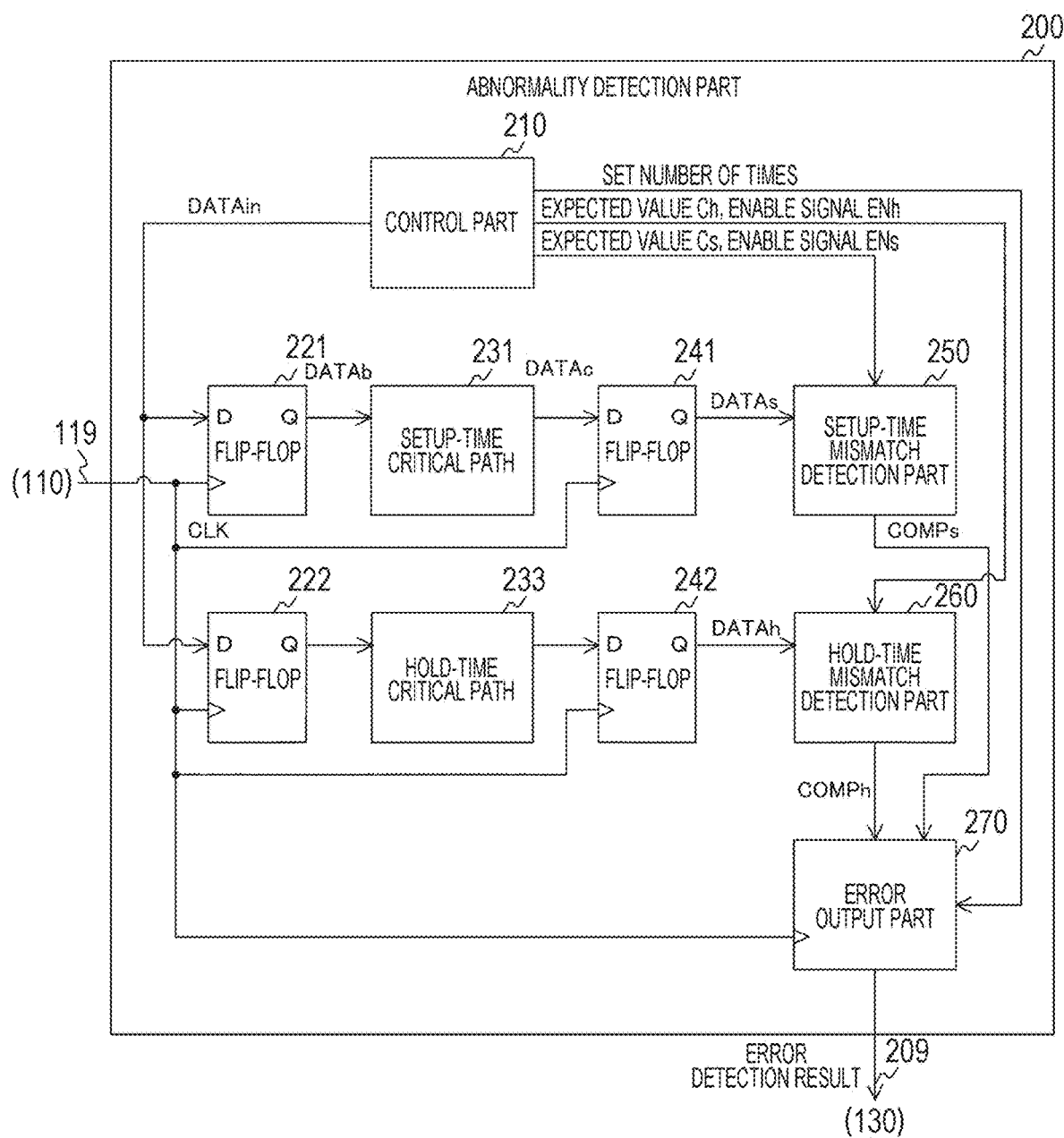
FIG. 2 is a block diagram illustrating an exemplary configuration of an abnormality detection part according to the first embodiment of the present technology.

FIG. 2 is a block diagram illustrating an exemplary configuration of the abnormality detection part 200 according to the first embodiment of the present technology. The abnormality detection part 200 includes a control part 210, flip-flops 221, 222, 241, and 242, a setup-time critical path 231, and a hold-time critical path 233. The abnormality detection part 200 further includes a setup-time mismatch detection part 250, a hold-time mismatch detection part 260, and an error output part 270.

The control part 210 is directed to controlling the entire abnormality detection part 200. The control part 210 generates a 1-bit data signal $DATA_{in}$, and supplies it to the flip-flops 221 and 222.

Further, the control part 210 generates an expected value Cs and an enable signal ENs, and supplies them to the setup-time mismatch detection part 250. Here, the expected value Cs is directed to comparing the data signal $DATA_{in}$ with a delay signal DATAs delayed by the setup-time critical path 231. Further, the enable signal ENs indicates whether or not to enable an operation of comparing the expected value Cs with the delay signal DATAs.

Further, the control part 210 generates an expected value Ch and an enable signal ENh, and supplies them to the hold-time mismatch detection part 260. Here, the expected value Ch is directed to comparing the data signal $DATA_{in}$ with a delay signal DATAh delayed by the hold-time critical path 233. Further, the enable signal ENh indicates whether or not to enable an operation of comparing the expected value Ch with the delay signal DATAh.

The flip-flop 221 holds the data signal $DATA_{in}$ in synchronization with the clock signal CLK. The flip-flop 221 supplies its holding data signal $DATA_{in}$ as data signal DATAb to the setup-time critical path 231.

The flip-flop 222 holds the data signal $DATA_{in}$ in synchronization with the clock signal CLK. The flip-flop 222 supplies its holding data signal $DATA_{in}$ to the hold-time critical path 233.

The setup-time critical path 231 delays the data signal DATAb over a delay time caused in two storage devices in the logic circuit 120. The delay time is set to substantially match with a time when a setup time error is caused in the storage devices in the logic circuit 120. For example, in a case where a setup time error is caused in a delay of N (N is a real number) nanoseconds (ns) or more, a delay time in which a predetermined margin is added to N is set. The setup-time critical path 231 outputs the delayed data signal $DATA_{in}$ as delay signal DATAc to the flip-flop 241.

The hold-time critical path 233 delays the data signal $DATA_{in}$ over a delay time caused in the two storage devices in the logical circuit 120. The delay time is set to substantially match with a time when a hold time error is caused in the storage devises in the logic circuit 120. For example, in a case where a hold time error is caused in a delay of M (M is a real number) nanoseconds (ns) or less, a delay time in which a predetermined margin is subtracted from M is set. Generally, the delay time when a setup time is caused is different from the delay time when a hold time is caused, and thus the hold-time critical path 233 is set with a different delay time from the setup-time critical path 231. The hold-time critical path 233 outputs the delayed data signal $DATA_{in}$ as delay signal DATAh to the flip-flop 242.

Additionally, the circuit configured of the setup-time critical path 231 and the hold-time critical path 233 is an exemplary delay part described in CLAIMS. Further, the setup-time critical path 231 is an exemplary first delay part described in CLAIMS, and the hold-time critical path 233 is an exemplary second delay part described in CLAIMS.

The flip-flop 241 is directed to holding the delay signal DATAc in synchronization with the clock signal CLK. The flip-flop 241 supplies its holding signal as delay signal DATAs to the setup-time mismatch detection part 250.

The flip-flop 242 is directed to holding the delay signal DATAh in synchronization with the clock signal CLK. The flip-flop 242 supplies its holding delay signal DATAh to the hold-time mismatch detection part 260.

Additionally, the circuit configured of the flip-flops 241 and 242 is an exemplary holding part described in CLAIMS.

The setup-time mismatch detection part 250 is directed to detecting whether or not the delay signal DATAs changes (or a setup error is caused) within the setup time. The setup-time mismatch detection part 250 compares the delay signal DATAs with the expected value Cs within a detection window in which the enable signal ENs is set at enable, and detects whether or not they match. A method for setting the expected value Cs and the detection window will be described below. In a case where the delay signal DATAs does not match with the expected value Cs, it is determined that a setup time error can be caused. The setup-time mismatch detection part 250 supplies the comparison result COMPs to the error output part 270. Additionally, the setup-time mismatch detection part 250 is an exemplary setup time detection part described in CLAIMS.

The hold-time mismatch detection part 260 is directed to detecting whether or not the delay signal DATAh changes (or a hold time error is caused) within the hold time. The hold-time mismatch detection part 260 compares the delay signal DATAh with the expected value Ch within a detection window in which the enable signal ENh is set at enable, and detects whether or not they match. A method for setting the expected value Ch and the detection window will be described below. In a case where the delay signal DATAh does not match with the expected value Ch, it is determined that a hold time error can be caused. The hold-time mismatch detection part 260 supplies the comparison result COMPh to the error output part 270. Additionally, the hold-time mismatch detection part 260 is an exemplary hold time detection part described in CLAIMS.

The error output part 270 is directed to outputting an error detection result indicating whether or not a timing error is caused. The error output part 270 counts the number of times a mismatch is detected by the setup-time mismatch detection part 250, and the number of times a mismatch is detected by the hold-time mismatch detection part 260. The error output part 270 then detects that a timing error is caused in a case where either counted value exceeds the set number of times. The error output part 270 generates and outputs an error detection result to the outside. The error detection result is set with "1" in a case where a timing error is caused, and with "0" in a case where an error is not caused, for example.

A comparative example is assumed herein in which only one critical path is provided. In the comparative example, the critical path can preferentially detect one of a setup time error and a hold time error, but can fail to detect the other in a case where the other error, which is not prioritized, is caused. For example, it is assumed that a hold time error is easily caused at a high supply voltage and a setup time error is easily caused at a low supply voltage. When a setup time error is preferentially detected at a high supply voltage in such LSI, a hold time error fails to be detected and the detection accuracy lowers.

To the contrary, the abnormality detection part 200 includes both the setup-time critical path 231 and the hold-time critical path 233, and thus can detect the presence of both a setup time error and a hold time error. Thereby, the abnormality detection part 200 can detect a timing error at high accuracy at either high or low supply voltage.

Additionally, the abnormality detection part 200 outputs a timing error in a case where either counted value exceeds the set number of times, but may increase the margin and output an alarm instead of an error as described below. Here, the alarm indicates a signal for warning that a timing error can be caused although a timing error is not caused.

Exemplary Configuration of Critical Path

FIG. 3 is a circuit diagram illustrating exemplary configurations of critical paths according to the first embodiment of the present technology. a of FIG. 3 is a circuit diagram illustrating an exemplary configuration of the setup-time critical path 231, and b of FIG. 3 is a circuit diagram illustrating an exemplary configuration of the hold-time critical path 233.

The setup-time critical path 231 includes a predetermined number of delay device stages 232. Further, the hold-time critical path 233 includes a predetermined number of delay device stages 234. However, the numbers of delay device stages in the critical paths are different. For example, the number of stages in the setup-time critical path 231 is larger than that in the hold-time critical path 233. Thus, an IR drop in the setup-time critical path 231 is larger than that in the hold-time.

FIG. 4 is a circuit diagram illustrating exemplary configurations of the setup-time mismatch detection part 250 and the hold-time mismatch detection part 260 according to the first embodiment of the present technology. a of FIG. 4 is a circuit diagram illustrating an exemplary configuration of the setup-time mismatch detection part 250, and b of FIG. 4 is a circuit diagram illustrating an exemplary configuration of the hold-time mismatch detection part 260.

The setup-time mismatch detection part 250 includes an exclusive NOR (EX-NOR) gate 251, a logical conjunction (AND) gate 252, an inverter 253, and a flip-flop 254. The EX-NOR gate 251 is directed to outputting EX-NOR between the expected value Cs and the delay signal DATAs to the AND gate 252. The AND gate 252 is directed to outputting AND between the output signal of the EX-NOR gate 251 and the enable signal ENs to an input terminal D of the flip-flop 254. The inverter 253 is directed to inverting and outputting the enable signal ENs to a clock terminal CK of the flip-flop 254. The flip-flop 254 is directed to holding AND from the AND gate 252 and to output it as the comparison result COMPs in synchronization with the output signal from the inverter 253.

The hold-time mismatch detection part 260 includes an EX-NOR gate 261, an AND gate 262, an inverter 263, and a flip-flop 264. The EX-NOR gate 261 is directed to outputting EX-NOR between the expected value Ch and the delay signal DATAh to the AND gate 262. The AND gate 262 is directed to outputting AND between the output signal of the EX-NOR gate 261 and the enable signal ENh to an input terminal D of the flip-flop 264. The inverter 263 is directed to inverting and outputting the enable signal ENh to a clock terminal CK of the flip-flop 264. The flip-flop 264 is directed to holding AND from the AND gate 262 and to outputting it as the comparison result COMPh in synchronization with the output signal from the inverter 263.

Exemplary Configuration of Error Output Part

Figure 5:
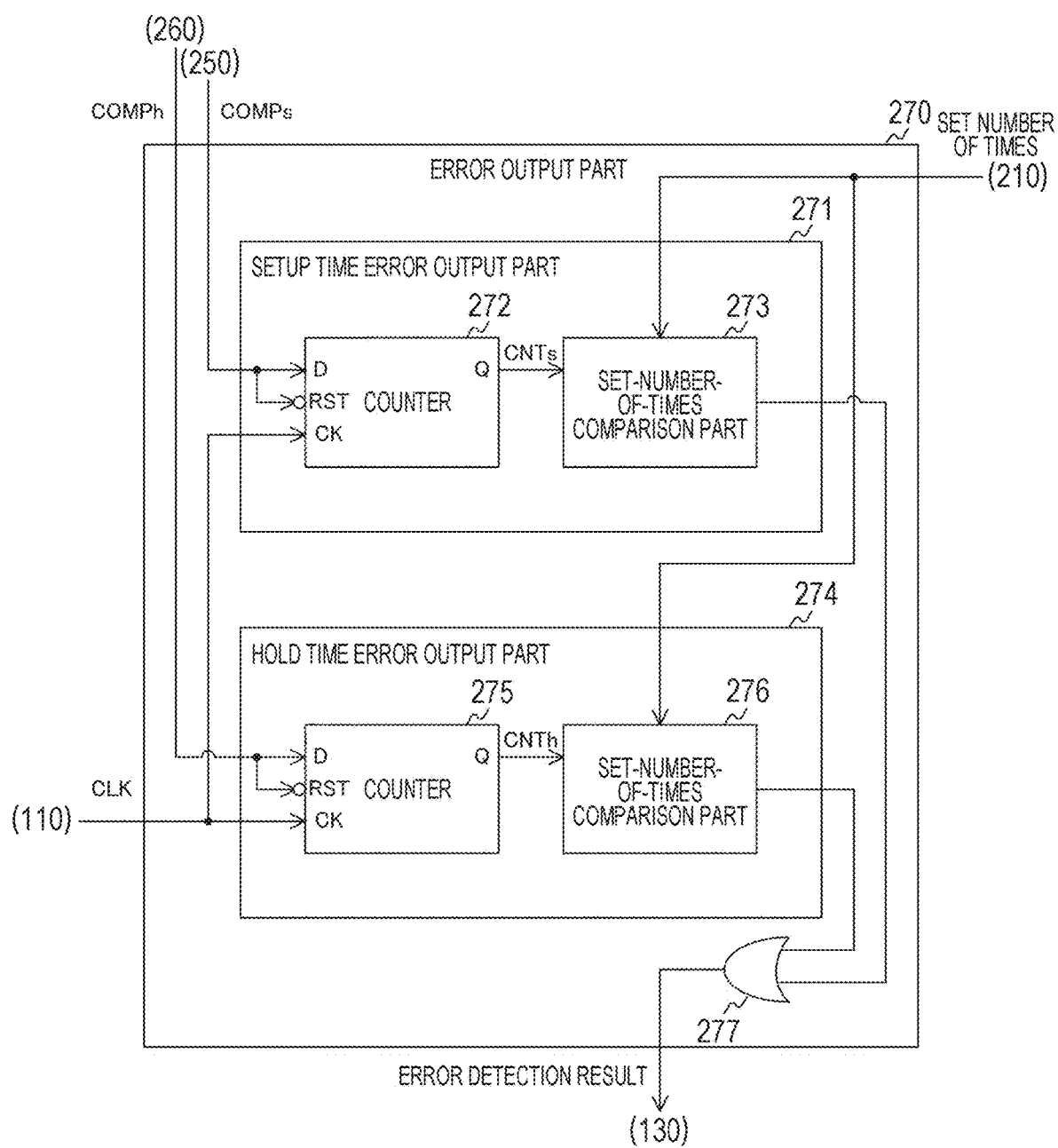
FIG. 5 is a circuit diagram illustrating an exemplary configuration of an error output part according to the first embodiment of the present technology.

FIG. 5 is a circuit diagram illustrating an exemplary configuration of the error output part 270 according to the first embodiment of the present technology. The error output part 270 includes a setup time error output part 271, a hold time error output part 274, and a logical add (OR) gate 277. The setup time error output part 271 further includes a counter 272 and a set-number-of-times comparison part 273. The hold time error output part 274 includes a counter 275 and a set-number-of-times comparison part 276.

The counter 272 is directed to counting the number of times a mismatch is consecutively detected in the setup-time mismatch detection part 250. The counter 272 initializes a counted value CNTs in synchronization with the clock signal CLK if the comparison result COMPs is at low level, for example. On the other hand, the counter 272 increments the counted value CNTs in synchronization with the clock signal CLK if the comparison result COMPs is at high level. The counter 272 outputs the counted value CNTs to the set-number-of-times comparison part 273.

The set-number-of-times comparison part 273 is directed to comparing the number of times of consecutive mismatch (the counted value CNTs) with a predetermined set number of times, and to determining whether or not the counted value CNTs exceeds the set number of times. In a case where the counted value CNTs exceeds the set number of times, it is determined that a setup time error is caused. The set-number-of-times comparison part 273 supplies a setup time error detection result indicating whether or not the counter value CNTs exceeds the set number of times (or a setup time error is caused) to the OR gate 277.

The counter 275 is directed to counting the number of times a mismatch is consecutively detected in the hold-time mismatch detection part 260. The counter 275 outputs a counted value CNTh to the set-number-of-times comparison part 276.

The set-number-of-times comparison part 276 is directed to comparing the number of times of consecutive mismatch (the counted value CNTh) with a predetermined set number of times, and to determining whether or not the counted value CNTh exceeds the set number of times. The set number of times is set by the control part 210. In a case where the counted value CNTh exceeds the set number of times, it is determined that a hold time error is caused. The set-number-of-times comparison part 276 supplies a hold time error detection result indicating whether or not the counted value CNTh exceeds the set number of times (or a hold time error is caused) to the OR gate 277. Additionally, the set numbers of times set in the set-number-of-times comparison parts 273 and 276 may be the same value or different values.

The OR gate 277 is directed to outputting OR between the setup time error detection result and the hold time error detection result as an error detection result to the output mask circuit 130.

Figure 6:
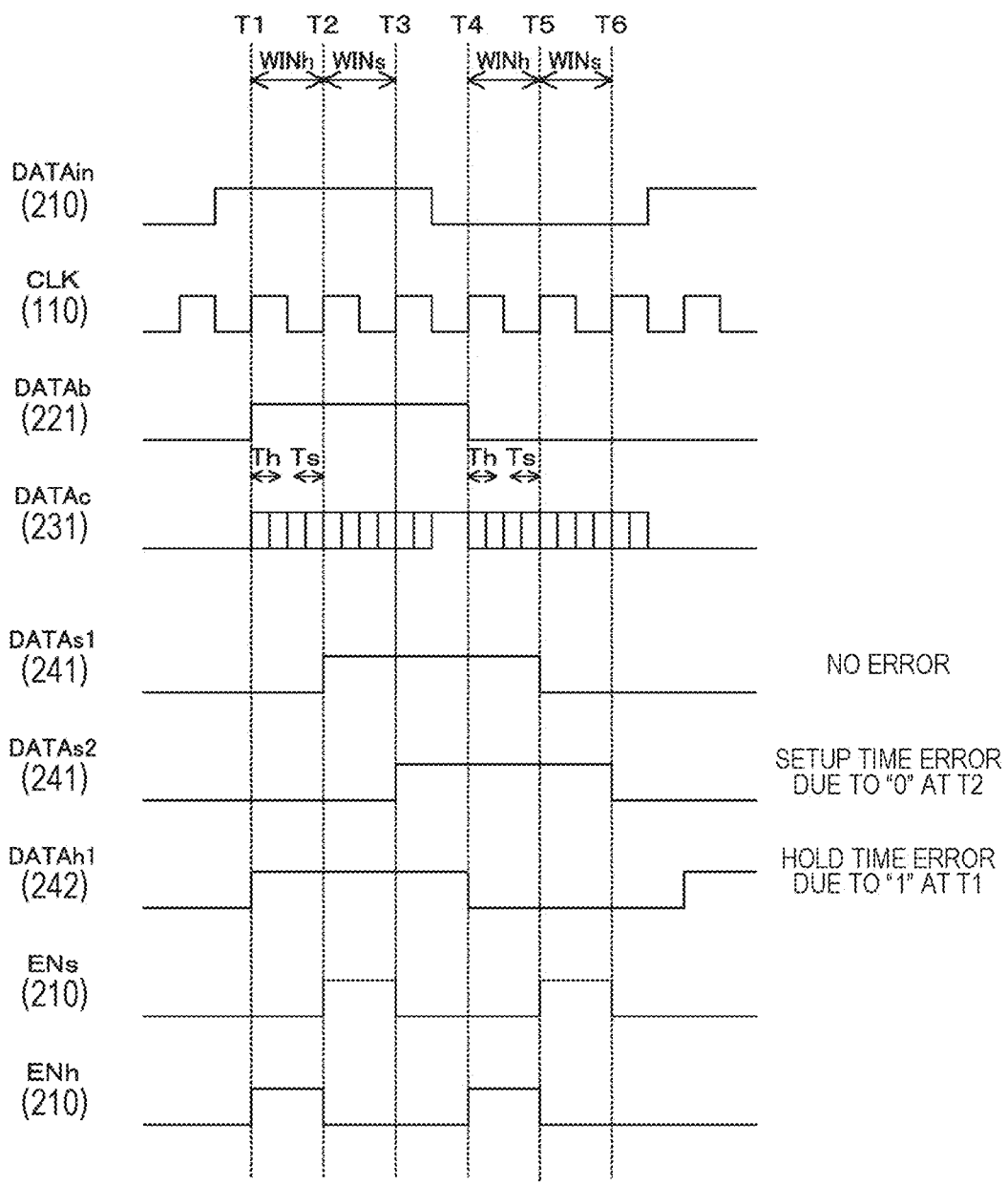
FIG. 6 is a timing chart illustrating exemplary transitions of data signals before and after delayed according to the first embodiment of the present technology.

FIG. 6 is a timing chart illustrating exemplary transitions of data signals before and after delayed according to the first embodiment of the present technology. The control part 210 inverts the data signal $DATA_{in}$ each time a certain period elapses. The period is set to be longer than the cycle of the clock signal CLK.

The flip-flop 221 before the critical path holds the data signal $DATA_{in}$ in synchronization with the clock signal CLK, and outputs it as data signal DATAb. The setup-time critical path 231 delays and outputs the data signal DATAb as delay signal DATAc. The delay time of the delay signal DATAc is not necessarily constant, and varies depending on conditions such as temperature or supply voltage.

The flip-flop 241 after the critical path holds the delay signal DATAc in synchronization with the clock signal CLK, and outputs it as delay signal DATAs.

In a delay signal DATAs1 in the delay signal DATAs, the data does not change in the setup time Ts before timing T2 when the clock signal CLK rises up and in the hold time Th after timing T1. That is, neither setup time error nor hold time error is caused. Additionally, the period in which a margin is added to the setup time Ts is an exemplary setup-time detection period described in CLAIMS, and the period in which a margin is added to the hold time Th is an exemplary hold-time detection period described in CLAIMS.

On the other hand, in a delay signal DATAs2 in the delay signal DATAs, the data changes in the setup time Ts. Thus, a setup time error is caused. Further, the data changes in a delay signal DATAh1 in the hold time Th. Thus, a hold time error is caused.

Here, a timing when the delay signal DATAs1 without a timing error rises up is assumed as T2. In addition, a period from timing T1 before timing T2 until just before timing T2 is assumed as hold-time detection window WINh. Further, a period from timing T2 to timing T3 is assumed as setup-time detection window WINs. The widths of the windows are set at the cycle of the clock signal CLK, for example.

The value of the delay signal DATAs1 without a hold time error does not change from "0" within the hold-time detection window WINh. On the other hand, the value of the delay signal DATAh1 in which a hold time error is caused changes from "0" to "1" at timing T1. Thus, the hold-time mismatch detection part 260 detects whether or not the expected value "0" matches with the delay signal DATAh within the hold-time detection window WINh thereby to detect the presence of a hold time error. The control part 210 sets the enable signal ENh at high level over the period of the hold-time detection window WINh, and sets the expected value Ch at "0".

Further, the value of the delay signal DATAs1 without a setup time error does not change from "1" within the setup-time detection window WINs. On the other hand, the value of the delay signal DATAs2 in which a setup time error is caused is "0" at and after timing T2. Thus, the setup-time mismatch detection part 250 detects whether or not the expected value "1" matches with the delay signal DATAs within the setup-time detection window WINs thereby to detect the presence of a setup time error. The control part 210 sets the enable signal ENs at high level over the period of the setup-time detection window WINs, and sets the expected value Cs at "1".

Further, the hold-time detection window is set in a period from timing T4 before timing T5 when the delay signal DATAs1 falls down until just before timing T5. The setup-time detection window is set in a period from timing T5 to timing T6. The control part 210 then sets the enable signal ENh at high level over the period of the hold-time detection window WINh, and sets the expected value Ch at "1". Further, the control part 210 sets the enable signal ENs at high level over the period of the setup-time detection window WINs, and sets the expected value Cs at "0".

Exemplary Operations of Abnormality Detection Part

Figure 7:
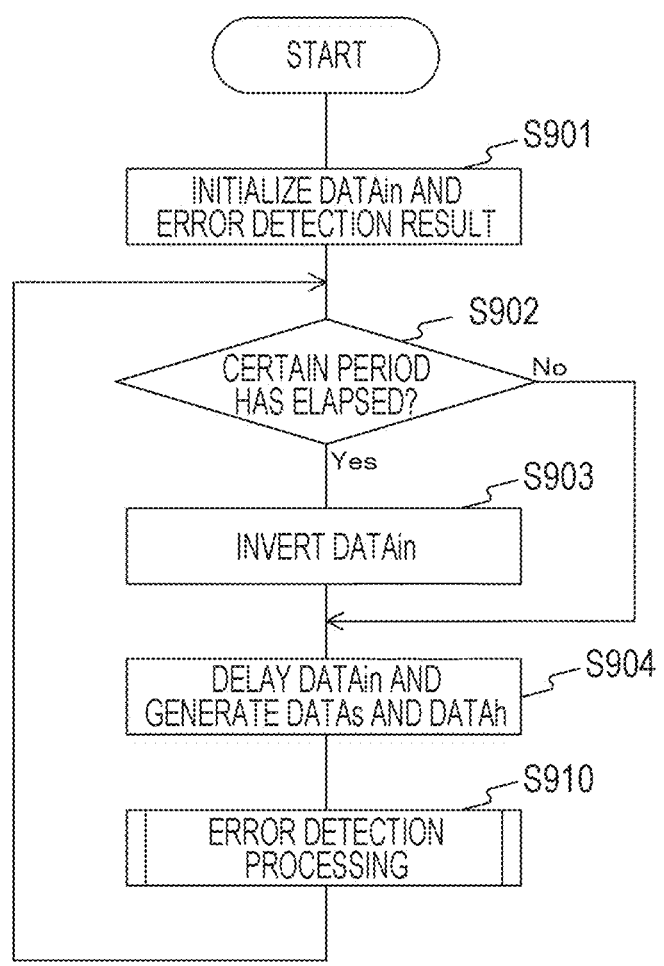
FIG. 7 is a flowchart illustrating exemplary operations of the abnormality detection part according to the first embodiment of the present technology.

FIG. 7 is a flowchart illustrating exemplary operations of the abnormality detection part 200 according to the first embodiment of the present technology. The operations are started when the semiconductor integrated circuit 100 is powered on, for example.

The abnormality detection part 200 sets the data signal DATA$_{in}$ and the error detection result at an initial value (such as "0") (step S901). The abnormality detection part 200 then determines whether or not a certain period has elapsed (step S902). Ina case where the certain period has elapsed (step S902: Yes), the data signal DATA$_{in}$ is inverted (step S903).

In a case where the certain period has not elapsed (step S902: No) or after step S903, the abnormality detection part 200 delays the data signal DATA$_{in}$ and generates the delay signals DATAs and DATAh (step S904). The abnormality detection part 200 then performs an error detection processing of detecting an error (step S910), and repeatedly performs step S902 and its subsequent steps.

Figure 8:
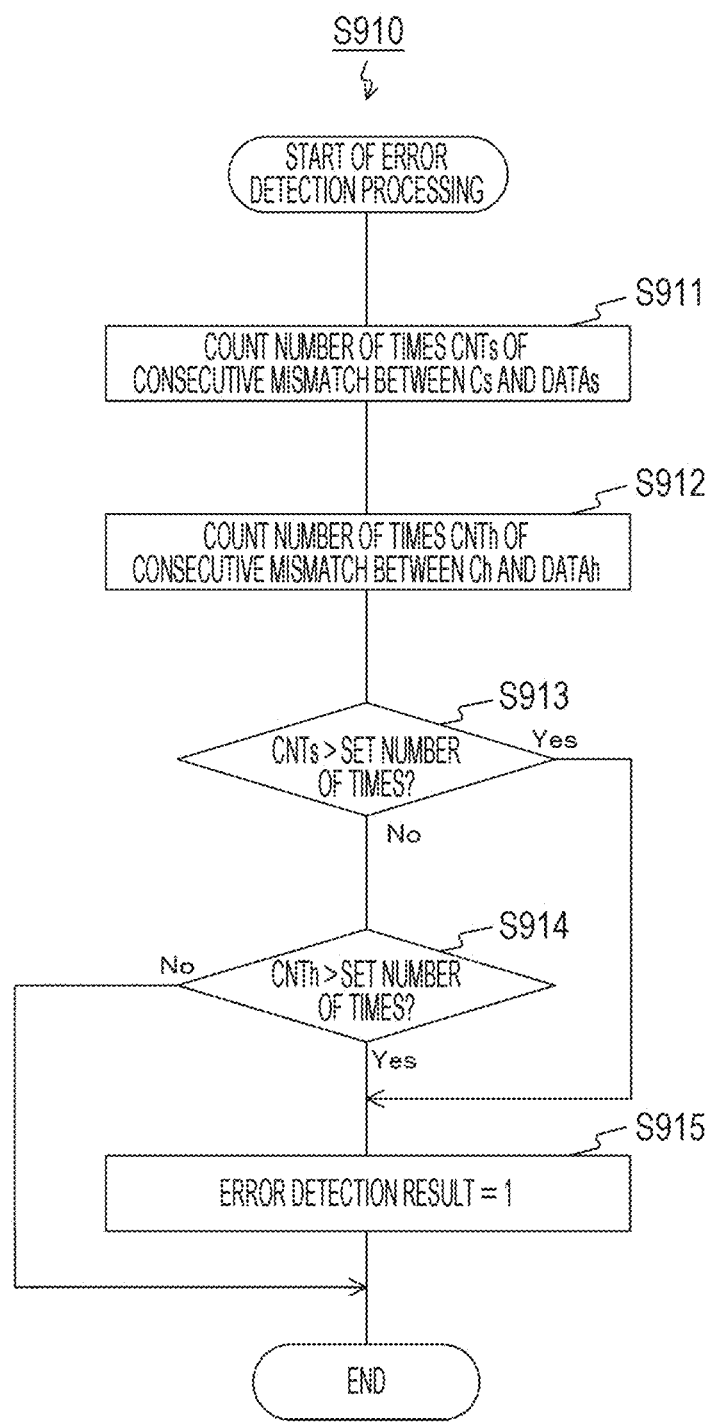
FIG. 8 is a flowchart illustrating am exemplary error detection processing according to the first embodiment of the present technology.

FIG. 8 is a flowchart illustrating an exemplary error detection processing according to the first embodiment of the present technology. The error output part 270 counts the number of times (counted value CNTs) a mismatch between the expected value Cs and the delay signal DATAs is consecutively caused (step S911), and counts the number of times (counted value CNTh) a mismatch between the expected value Ch and the delay signal DATAh is consecutively caused (step S912). The error output part 270 then determines whether or not the counted value CNTs is higher than the set number of times (step S913). In a case where the counted value CNTs is the set number of times or less (step S913: No), the error output part 270 determines whether or not the counted value CNTh is higher than the set number of times (step S914).

In a case where the counted value CNTs is higher than the set number of times (step S913: Yes) or in a case where the counted value CNTh is higher than the set number of times (step S914: Yes), the error output part 270 sets the error detection result at "1" and outputs it to the outside (step S915). In a case where the counted value CNTs is the set number of times or less (step S914: No) or after step S915, the error output part 270 terminates the error detection processing.

In this way, according to the first embodiment of the present technology, the setup-time mismatch detection part 250 detects whether or not one delay signal DATAs of the two delay signals matches with the expected value Cs, thereby detecting the presence of a setup error. Further, the hold-time mismatch detection part 260 detects whether or not the other delay signal DATAh of the two delay signals matches with the expected value Ch, thereby detecting the presence of a hold time error. The timing error detection accuracy can be further improved when the presence of both a setup time error and a hold time error is detected than in a case where only one of a setup error and a hold time error is detected.

2. Second Embodiment

The delay times of the critical paths are fixed according to the first embodiment described above, but the delay times vary in which an error is caused due to conditions such as LSI type, supply voltage, and temperature. Thus, it is desirable to change the delay times depending on the conditions. The abnormality detection part 200 according to a second embodiment is different from that according to the first embodiment in that the delay times of the critical paths are changed depending on conditions such as LSI type.

Figure 9:
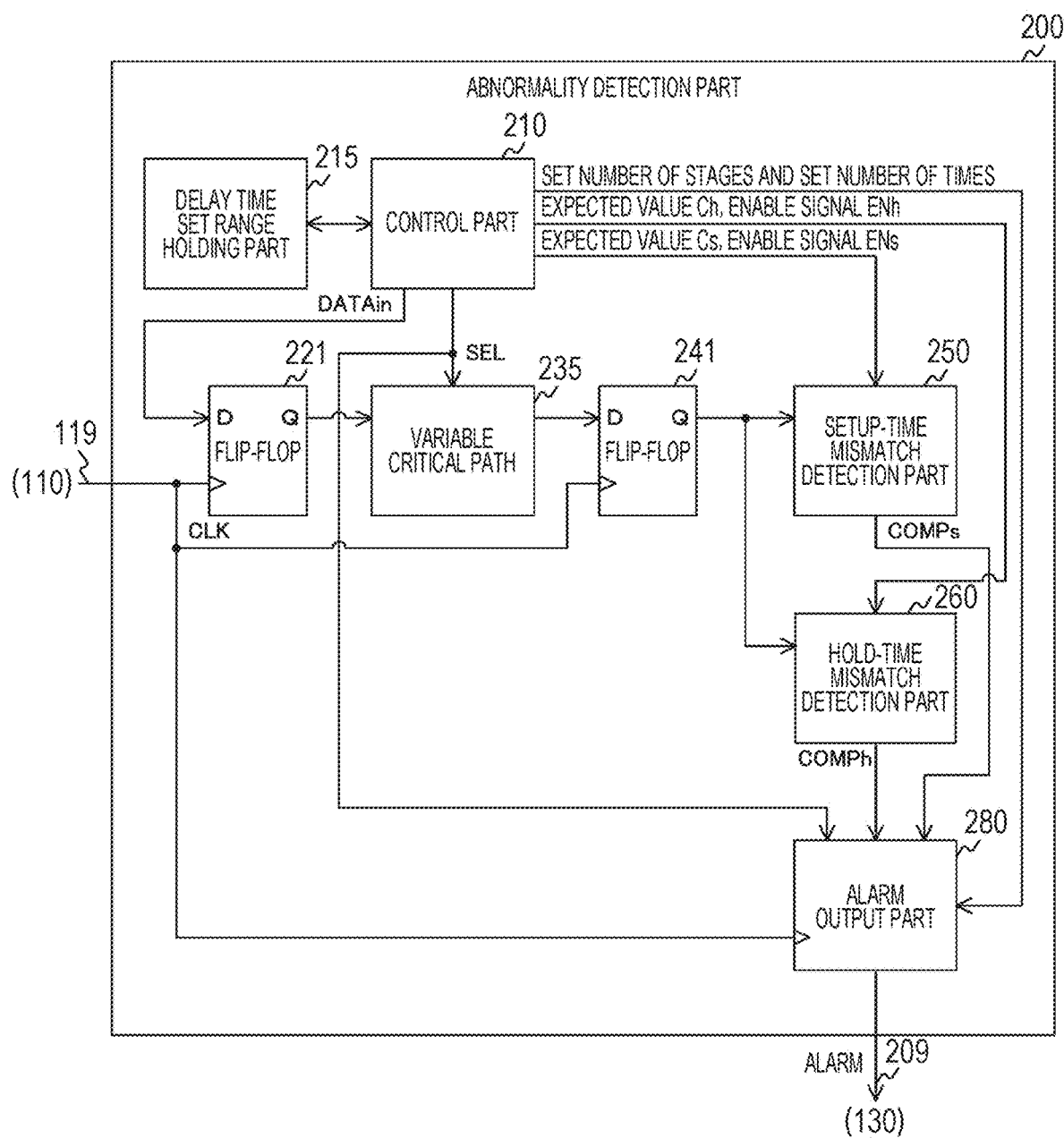
FIG. 9 is a block diagram illustrating an exemplary configuration of the abnormality detection part according to a second embodiment of the present technology.

FIG. 9 is a block diagram illustrating an exemplary configuration of the abnormality detection part 200 according to the second embodiment of the present technology. The abnormality detection part 200 according to the second embodiment further includes a delay time set range holding part 215. Further, the abnormality detection part 200 includes a variable critical path 235 instead of the setup-time critical path 231 and the hold-time critical path 233, and does not include the flip-flops 222 and 242. The abnormality detection part 200 further includes an alarm output part 280 instead of the error output part 270.

The delay time set range holding part 215 is directed to holding setup-time and hold-time delay time ranges to be set in the variable critical path 235 per condition such as LSI type. The set-up time delay time range is different from the hold-time delay time range. For example, the setup-time delay time is set to be longer than the hold-time delay time.

Further, the control part 210 according to the second embodiment previously holds the conditions such as LSI type, supply voltage, and temperature. The control part 210 reads a set range corresponding to the conditions from the delay time set range holding part 215, and generates a selection signal SEL on the basis of the set range. For example, in a case where the set range is from "0" to "9", a selection signal SEL corresponding to "0" to a selection signal SEL corresponding to "9" are sequentially generated. Further, the selection signals SEL are input also into the alarm output part 280.

The variable critical path 235 is directed to switching the delay times depending on a selection signal SEL. The variable critical path 235 supplies a delay signal to the flip-flop 241. The flip-flop 241 outputs its holding signal to both the setup-time mismatch detection part 250 and the hold-time mismatch detection part 260. In this way, the setup-time delay time and the hold-time delay time can be sequentially set in the variable critical path 235, and thus the two critical paths do not need to be provided unlike in the first embodiment.

The control part 210 then causes only the setup-time mismatch detection part 250 to detect a mismatch by the enable signal ENs while the setup-time delay time is set. Further, the control part 210 causes only the hold-time mismatch detection part 260 to detect a mismatch by the enable signal ENh while the hold-time delay time is set.

Here, according to the second embodiment, an alarm is output instead of an error, and thus the margin of the delay time in the variable critical path 235 is set to be longer than that in the first embodiment.

The alarm output part 280 is directed to outputting an alarm for warning that a timing error can be caused. The alarm output part 280 measures the number of delay stages in which a mismatch is detected by the setup-time mismatch detection part 250 and the number of delay stages in which a mismatch is detected by the hold-time mismatch detection part 260. The alarm output part 280 then outputs an alarm to the outside in a case where either of the numbers of delay stages exceeds the set number of stages.

Additionally, the abnormality detection part 200 outputs an alarm in a case where either of the numbers of delay stages exceeds the set number of stages, but decreases the margin and may output a timing error instead of an alarm like in the first embodiment.

Figure 10:
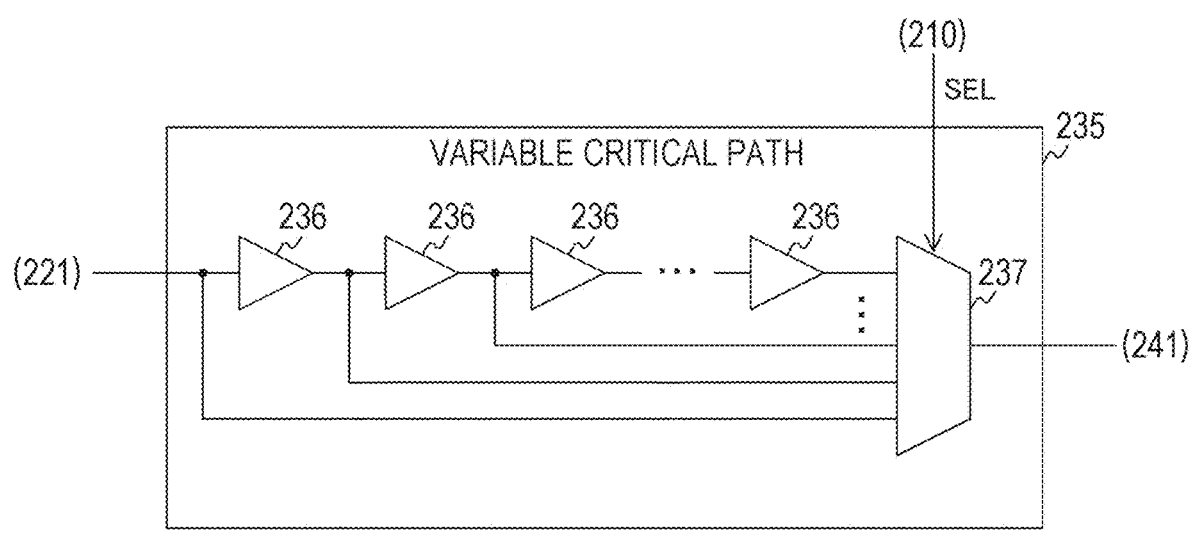
FIG. 10 is a circuit diagram illustrating an exemplary configuration of a variable critical path according to the second embodiment of the present technology.

FIG. 10 is a circuit diagram illustrating an exemplary configuration of the variable critical path 235 according to the second embodiment of the present technology. The variable critical path 235 includes a predetermined number of stages of delay device 236, and a selector 237.

Each delay device 236 outputs a delayed signal to its subsequent delay device 236 and the selector 237. Further, the not-delayed data signal $DATA_{in}$ is input into the first delay device 236 and the selector 237.

The selector 237 is directed to switching the delay times according to a selection signal SEL. The selector 237 selects a signal of the delay time indicated by the selection signal SEL, and outputs it to the flip-flop 241.

Figure 11:
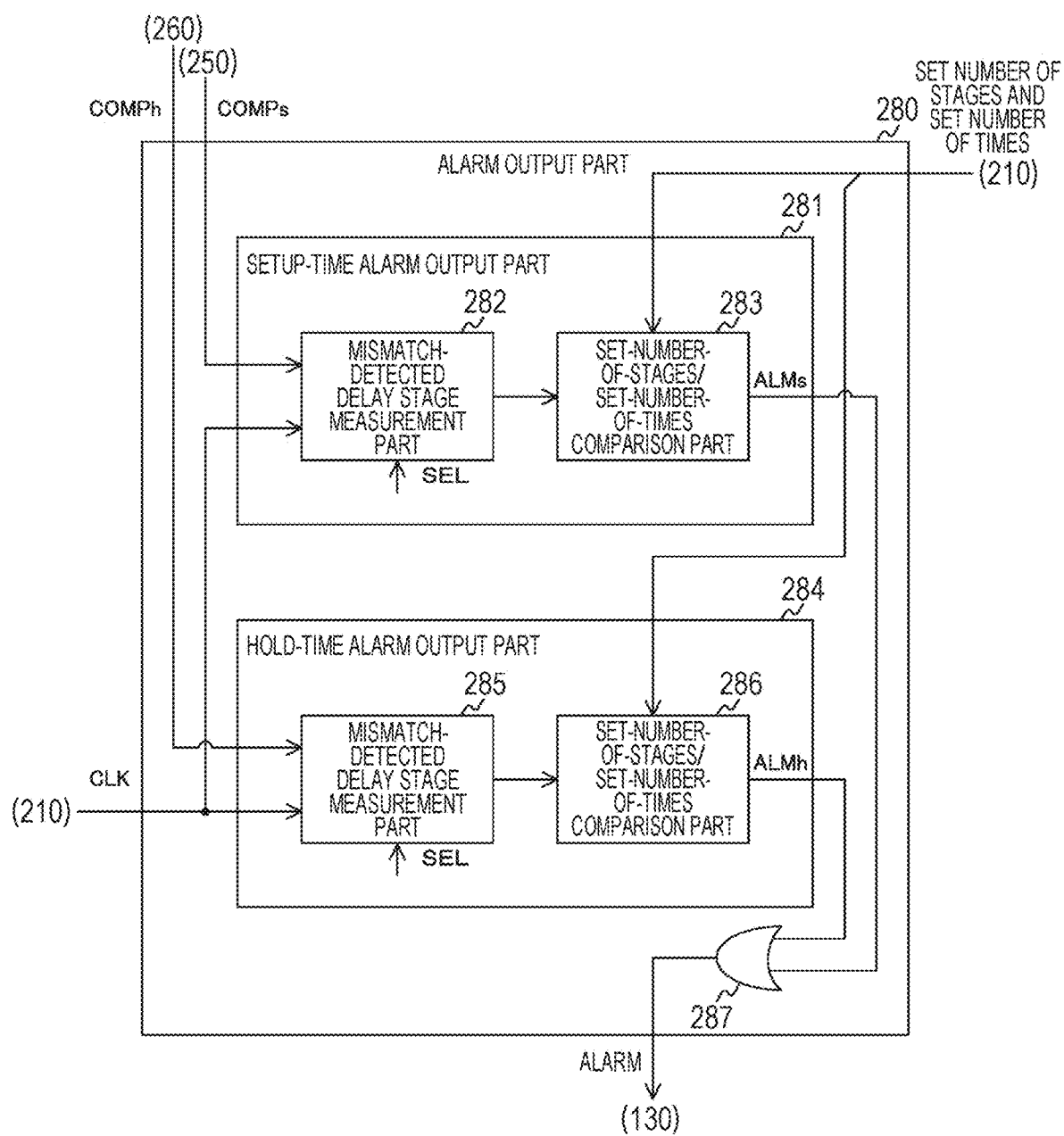
FIG. 11 is a block diagram illustrating an exemplary configuration of an alarm output part according to the second embodiment of the present technology.

FIG. 11 is a block diagram illustrating an exemplary configuration of the alarm output part 280 according to the second embodiment of the present technology. The alarm output part 280 includes a setup-time alarm output part 281, a hold-time alarm output part 284, and an OR gate 287. The setup-time alarm output part 281 includes a mismatch-detected delay stage measurement part 282 and a set-number-of-stages/number-of-consecutive-times comparison part 283. Further, the hold-time alarm output part 284 includes a mismatch-detected delay stage measurement part 285 and a set-number-of-stages/number-of-consecutive-times comparison part 286.

The mismatch-detected delay stage measurement part 282 is directed to measuring the number of delay stages in which a mismatch is detected by the setup-time mismatch detection part 250. The mismatch-detected delay stage measurement part 282 supplies the number of delay stages corresponding to a selection signal SEL when a mismatch is caused as a measured value to the set-number-of-stages/number-of-consecutive-times comparison part 283.

The set-number-of-stages/number-of-consecutive-times comparison part 283 is directed to comparing the measured value of the mismatch-detected delay stage measurement part 282 with a predetermined set number of stages, and to comparing the number of times the measured value lower than the set number of stages is consecutive with the set number of times. The set number of stages and the set number of times are set by the control part 210. The set-number-of-stages/number-of-consecutive-times comparison part 283 outputs the comparison result with the set number of times as setup-time alarm ALMs to the OR gate 287. For example, the setup-time alarm ALMs is set at "1" in a case where the number of times the measured value lower than the set number of stages is consecutive is larger than the set number of times, and at "0" in a case where the number of consecutive times is the set number of times or less.

The mismatch-detected delay stage measurement part 285 is directed to measuring the number of delay stages in which a mismatch is detected by the hold-time mismatch detection part 260. The mismatch-detected delay stage measurement part 285 supplies the number of delay stages corresponding to a selection signal SEL when a mismatch is caused as a measured value to the set-number-of-stages/number-of-consecutive-times comparison part 286.

The set-number-of-stages/number-of-consecutive-times 286 is directed to comparing the measured value of the mismatch-detected delay stage measurement part 285 with the predetermined set number of stages, and to comparing the number of times the measured value higher than the set number of stages is consecutive with the set number of times. The set number of stages is set at a different value from that for setup time by the control part 210. The set-number-of-stages/number-of-consecutive-times comparison part 286 outputs the comparison result with the set number of times as hold-time alarm ALMh to the OR gate 287. For example, the hold-time alarm ALMh is set at "1" in a case where the number of times the measured value higher than the set number of stages is consecutive is larger than the set number of times, and at "0" in a case where the number of consecutive times is the set number of times or less.

The OR gate 287 is directed to outputting OR between the setup-time alarm ALMs and the hold-time alarm ALMh as an alarm to the outside. In a case where the number of delay stages in which a setup-time mismatch is caused is smaller than the set number of stages or in a case where the number of delay stages in which a hold-time mismatch is caused is larger than the set number of stages, an alarm is output due to OR.

Figure 12:
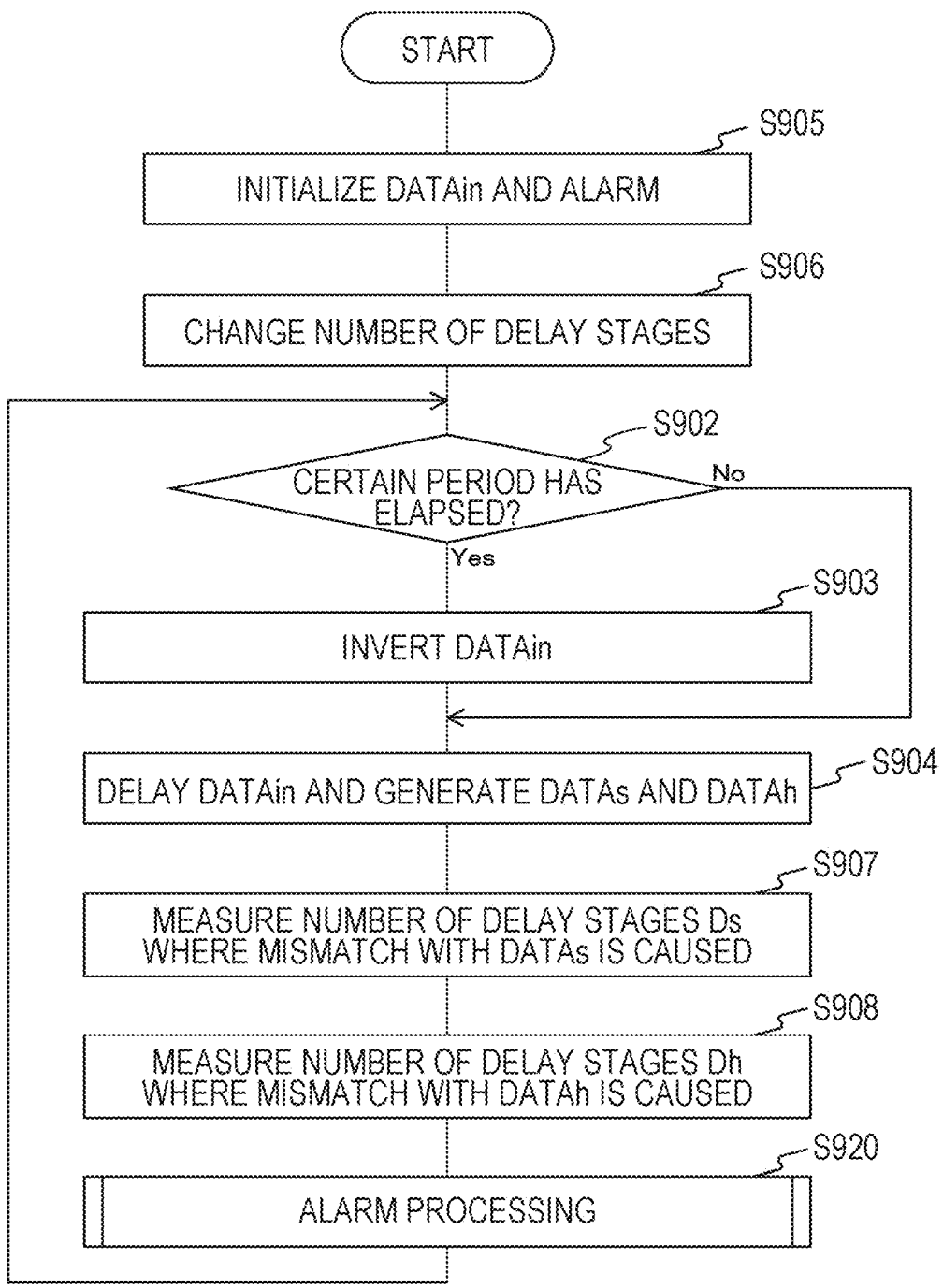
FIG. 12 is a flowchart illustrating exemplary operations of the abnormality detection part according to the second embodiment of the present technology.

FIG. 12 is a flowchart illustrating exemplary operations of the abnormality detection part 200 according to the second embodiment of the present technology. The operations of the abnormality detection part 200 according to the second embodiment are different from those according to the first embodiment in that steps S905 and S920 are performed instead of steps S901 and 910. Further, steps S906, S907, and S908 are further performed. At first, the abnormality detection part 200 sets the data signal $DATA_{in}$ and the alarm at an initial value (such as "0") (step S905). The abnormality detection part 200 then changes the number of delay stages within a certain range (step S906). Further, the abnormality detection part 200 measures the number of delay stages (Ds) in which a mismatch between the delay signal DATAs and the expected value Cs is caused after step S904 (step S907). Further, the abnormality detection part 200 measures the number of delay stages (Dh) in which a mismatch between the delay signal DATAh and the expected value Ch is caused (step S908), and performs an alarm processing of outputting an alarm (step S920). The abnormality detection part 200 repeatedly performs step S906 and its subsequent steps after step S920.

Figure 13:
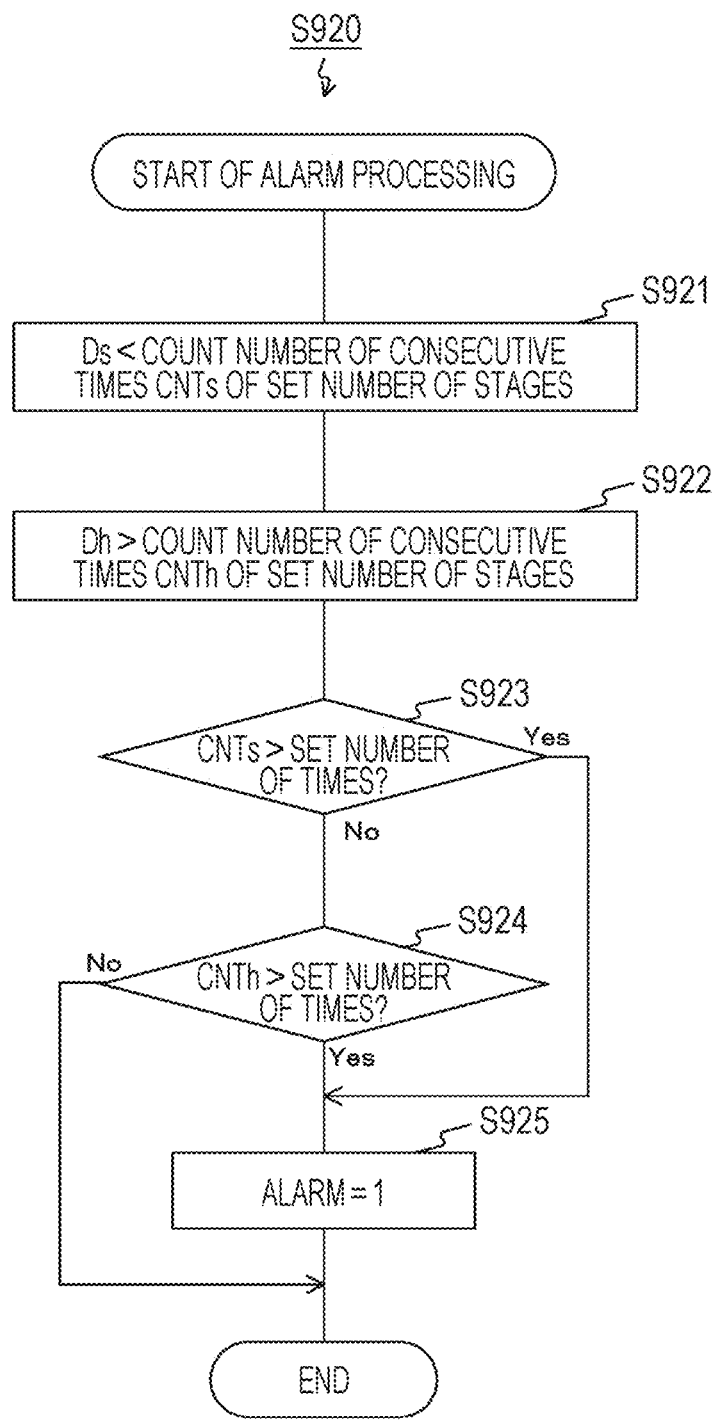
FIG. 13 is a flowchart illustrating an exemplary alarm processing according to the second embodiment of the present technology.

FIG. 13 is a flowchart illustrating an exemplary alarm processing according to the second embodiment of the present technology. The alarm output part 280 counts the number of times CNTs the measured value Ds is consecutively determined as lower than the set number of stages (step S921), and counts the number of times CNTh the measured value Dh is consecutively determined as higher than the set number of stages (step S922).

The alarm output part 280 then determines whether or not the counted value CNTs is higher than the set number of times (step S923). In a case where the counted value CNTs is the set number of times or less (step S923: No), the alarm output part 280 determines whether or not the counted value CNTh is higher than the set number of times (step S924). In a case where the counted value CNTs is higher than the set number of times (step S923: Yes) or in a case where the counted value CNTh is higher than the set number of times (step S924: Yes), the alarm output part 280 sets the alarm at "1" and outputs it to the outside (step S925).

In a case where the counted value CNTs is the set number of times or less (step S924: No) or after step S925, the error output part 270 terminates the error detection processing.

In this way, according to the second embodiment of the present technology, the abnormality detection part 200 selects any of a plurality of paths with different delay times depending on the conditions such as LSI type, and thus the detection accuracy can be improved by an appropriate delay time even under the changed conditions.

3. Third Embodiment

According to the second embodiment described above, the abnormality detection part 200 masks output data thereby to restrict influences of an abnormality when a timing error is caused. However, the causes of abnormalities cannot be eliminated by only the masked output data. If the kinds of abnormalities such as supply voltage abnormality or clock signal CLK abnormality are determined, the causes of abnormalities can be eliminated by controlling a power supply circuit 140, for example. The abnormality detection part 200 according to a third embodiment is different from that according to the second embodiment in that the kind of an abnormality is determined.

Figure 14:
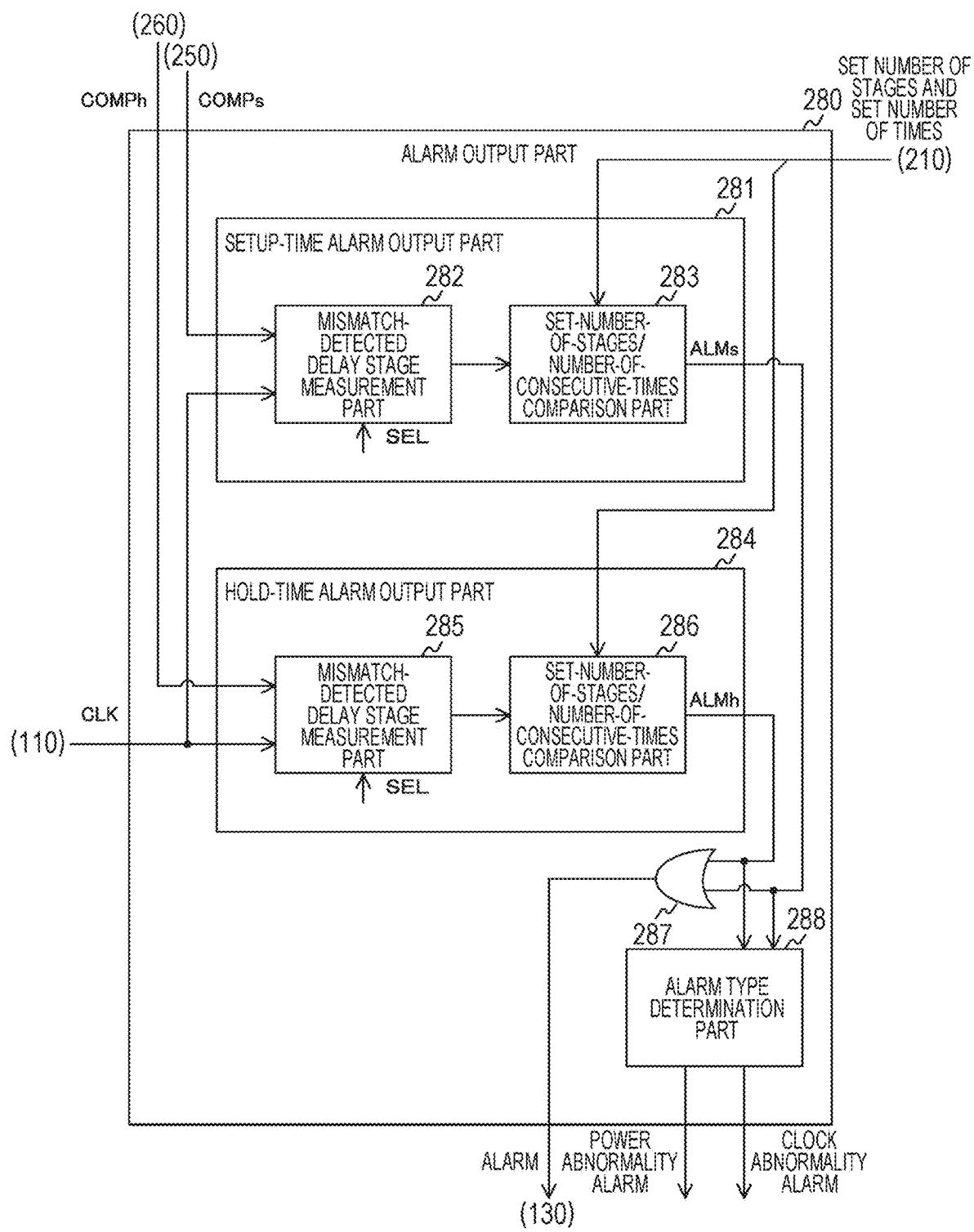
FIG. 14 is a block diagram illustrating an exemplary configuration of the alarm output part according to a third embodiment of the present technology.

FIG. 14 is a block diagram illustrating an exemplary configuration of the alarm output part 280 according to the third embodiment of the present technology. The alarm output part 280 according to a variant of the second embodiment is different from that according to the second embodiment in that it further includes an alarm type determination part 288.

The alarm type determination part 288 determines which of a power abnormality and a clock abnormality is caused on the basis of the setup-time alarm ALMs and the hold-time alarm ALMh. The alarm type determination part 288 outputs a power abnormality alarm in a case where a power abnormality can be caused, and outputs a clock abnormality alarm in a case where a clock abnormality can be caused. Additionally, the alarm type determination part 288 is an exemplary abnormality type determination part described in CLAIMS.

FIG. 15 is a diagram illustrating exemplary operations of the alarm type determination part 288 according to the third embodiment of the present technology. The alarm type determination part 288 outputs the power abnormality alarm in a case where the setup-time alarm ALMs is "0" and the hold-time alarm ALMh is "1". Further, the alarm type determination part 288 outputs the clock abnormality or power abnormality alarm to the outside in a case where the setup-time alarm ALMs is "1" and the hold-time alarm ALMh is "0". Further, the alarm type determination part 288 outputs the clock abnormality and power abnormality alarms to the outside in a case where the setup-time alarm ALMs and the hold-time alarm ALMh are "1".

Then, the external device can determine which of the supply voltage and the clock signal to control depending on which of the clock abnormality alarm and the power abnormality alarm is output.

In this way, according to the third embodiment of the present technology, the alarm type determination part 288 determines the kind of an abnormality, and thus the external device can determine which of the supply voltage and the clock signal to control.

Variant

According to the third embodiment described above, the abnormality detection part 200 determines which of the power abnormality and the clock abnormality is caused, but may determine the power abnormality in more detail, for example, due to rise or fall of the power. The abnormality detection part 200 according to a variant of the third embodiment is different from that according to the third embodiment in that it determines the kinds of abnormalities in more detail.

Figure 16:
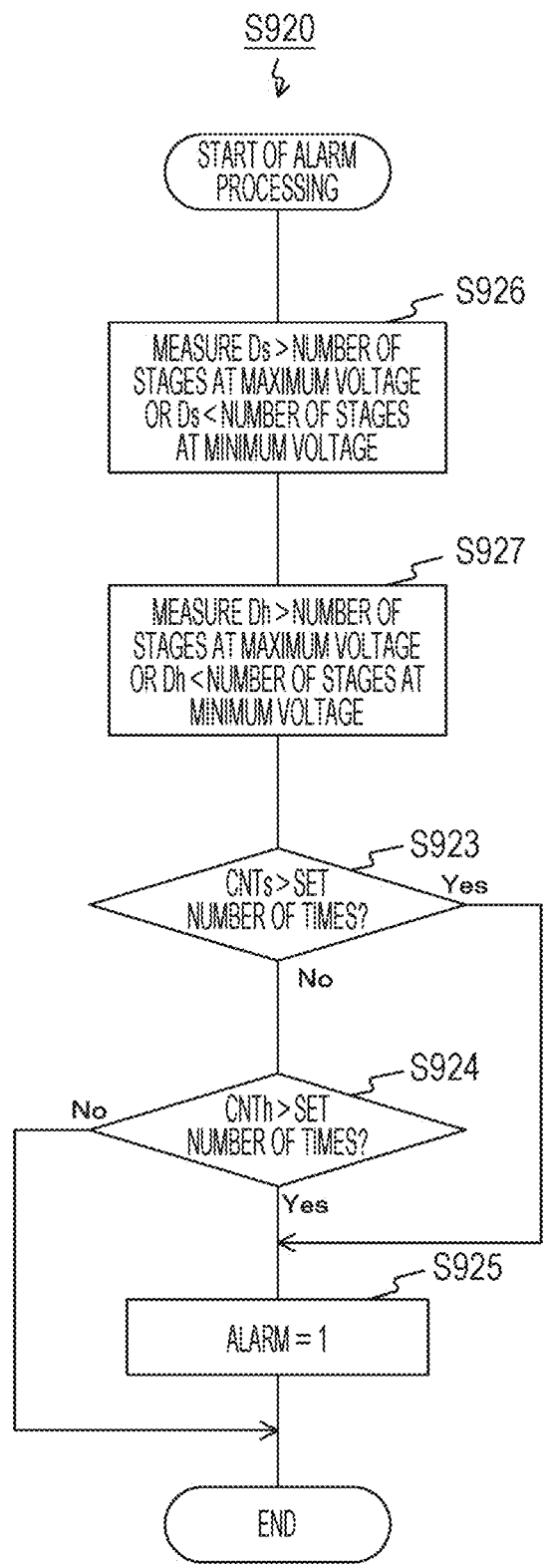
FIG. 16 is a flowchart illustrating an exemplary alarm processing according to a variant of the third embodiment of the present technology.

FIG. 16 is a flowchart illustrating an exemplary alarm processing according to the variant of the third embodiment of the present technology. The alarm processing according to the third embodiment is different from that according to the third embodiment in that steps S925 and S926 are performed instead of steps S921 and S922. The abnormality processing part 200 counts the number of times CNTs the measured Ds is consecutively determined as higher than the set number of stages at maximum voltage or lower than the set number of stages at minimum voltage (step S925). Further, the abnormality processing part 200 counts the number of times CNTh the measured Dh is consecutively determined as higher than the set number of stages at maximum voltage or lower than the set number of stages at minimum voltage (step S926). The alarm type determination method will be described below in detail.

FIG. 17 is a diagram illustrating exemplary operations of the alarm type determination part 288 according to the variant of the third embodiment of the present technology. The alarm type determination part 288 outputs the power abnormality alarm due to an increase in power in a case where Dh is determined as higher than the set number of stages at maximum voltage. Further, the alarm type determination part 288 outputs the power abnormality alarm due to a decrease in power in a case where Dh is determined as lower than the set number of stages at minimum voltage. The alarm type determination part 288 outputs the clock abnormality alarm due to a reduction in speed of the clock signal in a case where Dh is a value between the set number of stages at the minimum voltage and the set number of stages at maximum voltage and Ds is higher than the set number of stages at maximum voltage. The alarm type determination part 288 outputs the clock abnormality alarm due to an increase in speed of the clock signal in a case where Dh is a value between the set number of stages at minimum voltage and the set number of stages at maximum voltage and Ds is lower than the set number of stages at minimum voltage.

4. Fourth Embodiment

According to the first embodiment described above, the semiconductor integrated circuit 100 masks output data thereby to restrict influences of a timing error in a case where the timing error is caused. However, the causes of occurrence of a timing error cannot be eliminated by only the masked output data. Thus, it is desirable that the power supply circuit or the clock supply part 110 is further controlled to prevent a timing error from being caused when the timing error is caused due to an abnormality of the supply voltage or the clock signal CLK. The semiconductor integrated circuit 100 according to a fourth embodiment is different from that according to the first embodiment in that the power supply circuit or the clock supply part 110 is controlled thereby to prevent a timing error from being caused.

Figure 18:
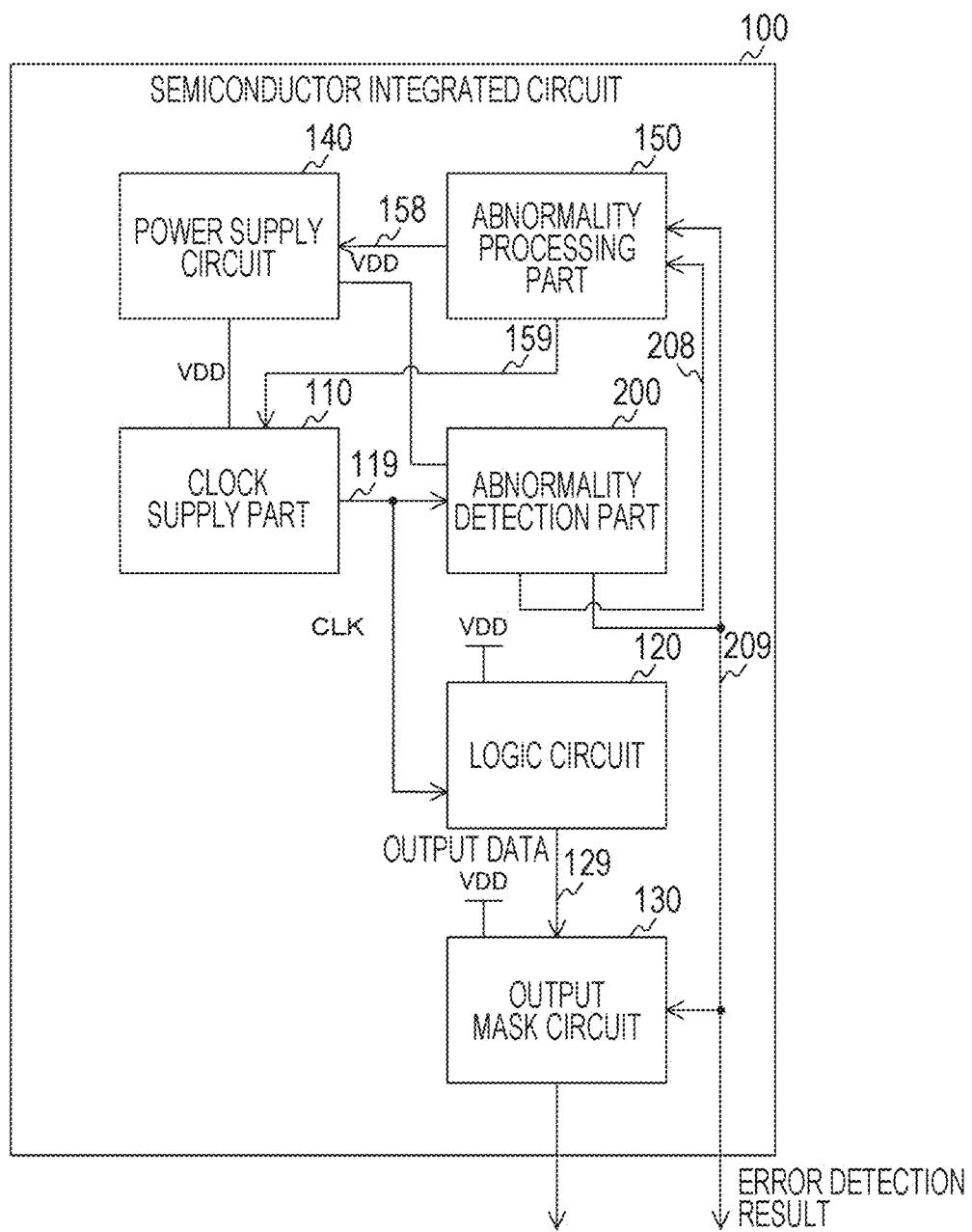
FIG. 18 is a block diagram illustrating an exemplary configuration of the semiconductor integrated circuit according to a fourth embodiment of the present technology.

FIG. 18 is a block diagram illustrating an exemplary configuration of the semiconductor integrated circuit 100 according to the fourth embodiment of the present technology. The semiconductor integrated circuit 100 according to the fourth embodiment further includes the power supply circuit 140 and an abnormality processing part 150. Further, the abnormality detection part 200 according to the second embodiment measures the supply voltage when a timing error is caused, and detects whether or not a power abnormality is caused. Then, the abnormality detection part 200 further supplies the error detection result to the abnormality processing part 150. Further, the abnormality detection part 200 supplies a power abnormality detection result indicating the presence of a power abnormality to the abnormality processing part 150. The power abnormality detection result is set at "1" in a case where a power abnormality is caused, and at "0" in a case where an abnormality is not caused, for example.

The power supply circuit 140 is directed to supplying a supply voltage VDD. The abnormality processing part 150 is directed to controlling the power supply circuit 140 or the clock supply part 110 when a timing error is caused. In a case where a timing error is caused but a power abnormality is not caused, the abnormality processing part 150 determines that an abnormality is caused in the clock signal CLK. The abnormality processing part 150 then initializes the clock supply part 110, or switches the main circuit to the preliminary circuit in the clock supply part 110, for example. On the other hand, in a case where a power abnormality is caused, the abnormality processing part 150 controls the power supply circuit 140 to set the supply voltage at a normal value.

As described above, the abnormality detection part 200 outputs the power abnormality detection result in addition to the error detection result so that decomposition is facilitated. Here, decomposition means that one safety request is decomposed into a plurality of solutions. All the solutions realize the original safety request (a vehicle is stopped when the brake pedal is stepped, for example) so that if one of the plurality of solutions fails, the other solutions can realize the safety request. Therefore, automotive safety integrity level (ASIL) to be met by each solution can be set to be lower.

Additionally, the power supply circuit 140 and the abnormality processing part 150 are provided in the semiconductor integrated circuit 100, but may be provided outside the semiconductor integrated circuit 100.

Figure 19:
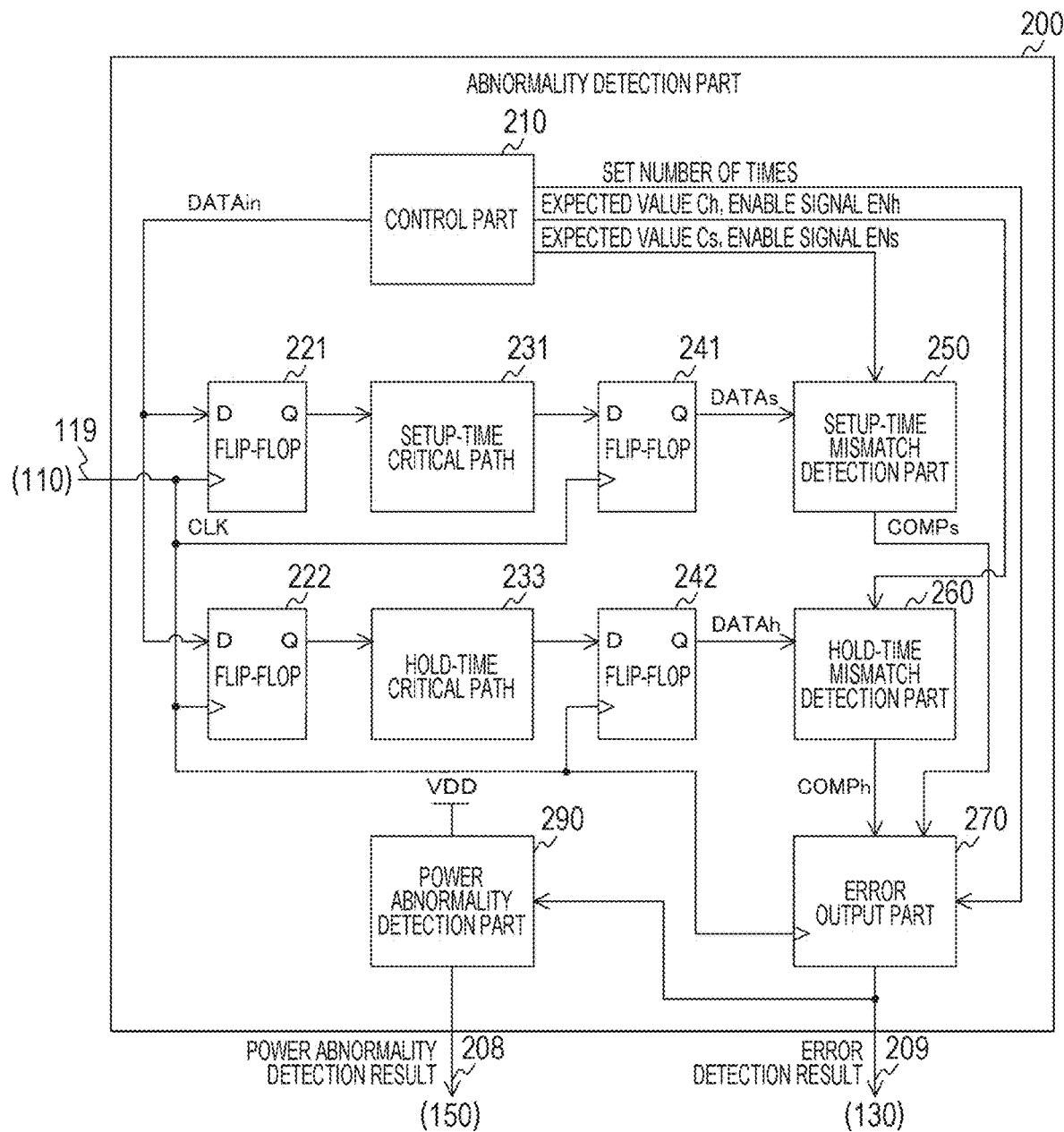
FIG. 19 is a block diagram illustrating an exemplary configuration of the abnormality detection part according to the fourth embodiment of the present technology.

FIG. 19 is a block diagram illustrating an exemplary configuration of the abnormality detection part 200 according to the fourth embodiment of the present technology. The abnormality detection part 200 according to the fourth embodiment is different from that according to the first embodiment in that it further includes a power abnormality detection part 290. Further, an error detection result is input also into the power abnormality detection part 290. The power abnormality detection part 290 is directed to detecting the presence of a power abnormality in a case where a timing error is detected.

Figure 20:
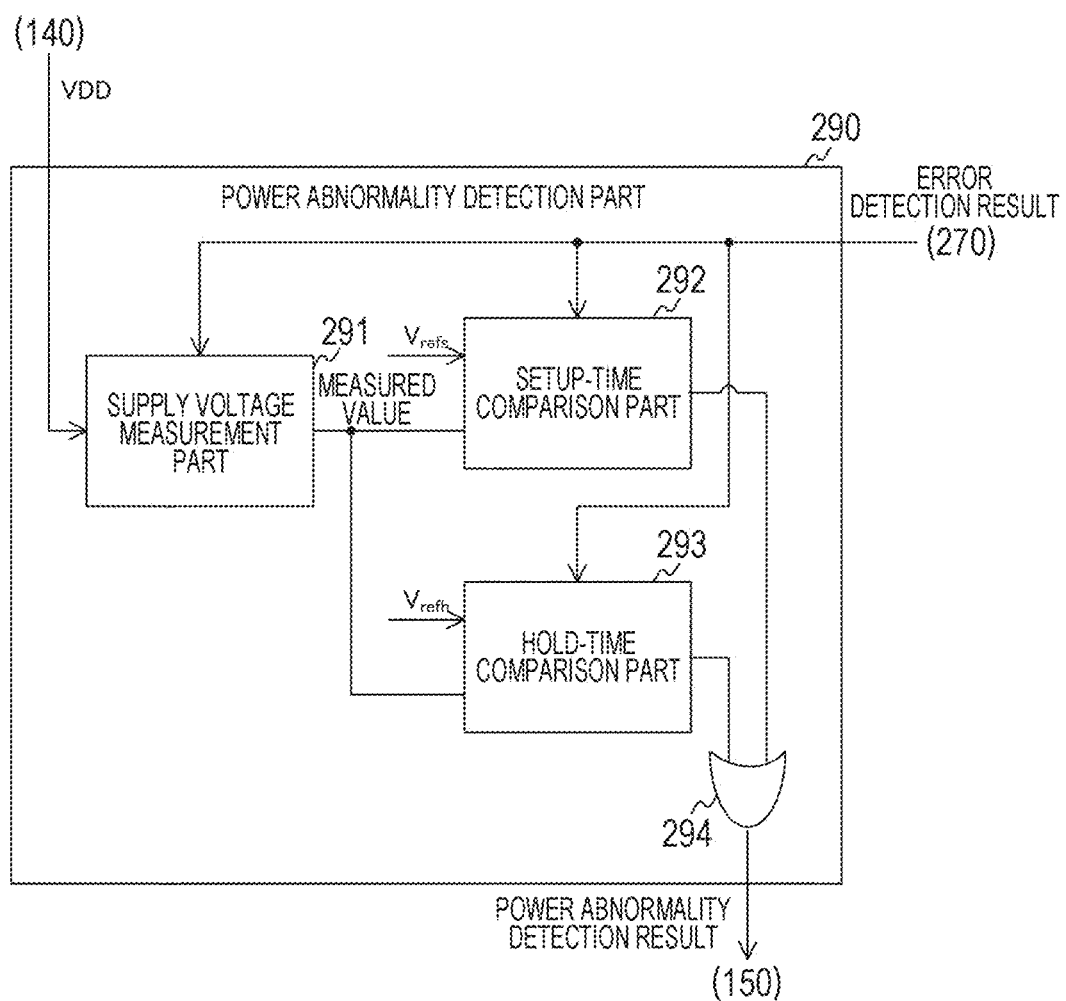
FIG. 20 is a block diagram illustrating an exemplary configuration of a power abnormality detection part according to the fourth embodiment of the present technology.

FIG. 20 is a block diagram illustrating an exemplary configuration of the power abnormality detection part 290 according to the fourth embodiment of the present technology. The power abnormality detection part 290 includes a supply voltage measurement part 291, a setup-time comparison part 292, a hold-time comparison part 293, and an OR gate 294.

The supply voltage measurement part 291 is directed to measuring the supply voltage VDD in a case where a timing error is caused. The supply voltage measurement part 291 AD-converts the analog supply voltage VDD thereby to generate a measured value. The supply voltage measurement part 291 then supplies the measured value to the setup-time comparison part 292 and the hold-time comparison part 293.

The setup-time comparison part 292 is directed to comparing the measured value of the supply voltage VDD with a digital set value indicating a reference voltage $V_{refs}$ in a case where a timing error is caused. The reference voltage $V_{refs}$ is a voltage when a setup time error is caused. For example, a setup time error is caused at a lower voltage than 0.9 volts (V), the set value indicating "0.9" is set. The setup-time comparison part 292 outputs the comparison result "1" to the OR gate 294 in a case where the supply voltage VDD is lower than the reference voltage $V_{refs}$. On the other hand, in a case where the supply voltage VDD is the reference voltage $V_{refs}$ or more, the comparison result "0" is output.

The hold-time comparison part 293 is directed to comparing the measured value of the supply voltage VDD with a digital set value indicating a reference voltage $V_{refh}$ in a case where a timing error is caused. The reference voltage $V_{refh}$ is a voltage when a hold time error is caused. For example, in a case where a hold time error is caused at a higher voltage than 1.3 volts (V), the set value indicating "1.3" is set. The hold-time comparison part 293 outputs the comparison result "1" to the OR gate 294 in a case where the supply voltage VDD is higher than the reference voltage $V_{refh}$. On the other hand, in a case where the supply voltage VDD is the reference voltage $V_{refh}$ or less, the comparison result "0" is output.

The OR gate 294 is directed to outputting OR between the respective comparison results of the setup-time comparison part 292 and the hold-time comparison part 293 as a power abnormality detection result.

FIG. 21 is a diagram illustrating exemplary operations of the abnormality processing part 150 according to the fourth embodiment of the present technology. In a case where the power abnormality detection result is "1" (with abnormality), the abnormality processing part 150 determines that the power is abnormal, and controls the power supply circuit 140. The abnormality processing part 150 initializes the power supply circuit 140, or controls the supply voltage VDD within a range between the reference voltages $V_{refs}$ and $V_{refh}$, for example.

Further, in a case where the error detection result is "1" (with error) and the power abnormality detection result is "0" (without abnormality), the abnormality processing part 150 determines that the clock is abnormal, initializes the clock supply part 110, and switches to the preliminary circuit, for example.

Figure 22:
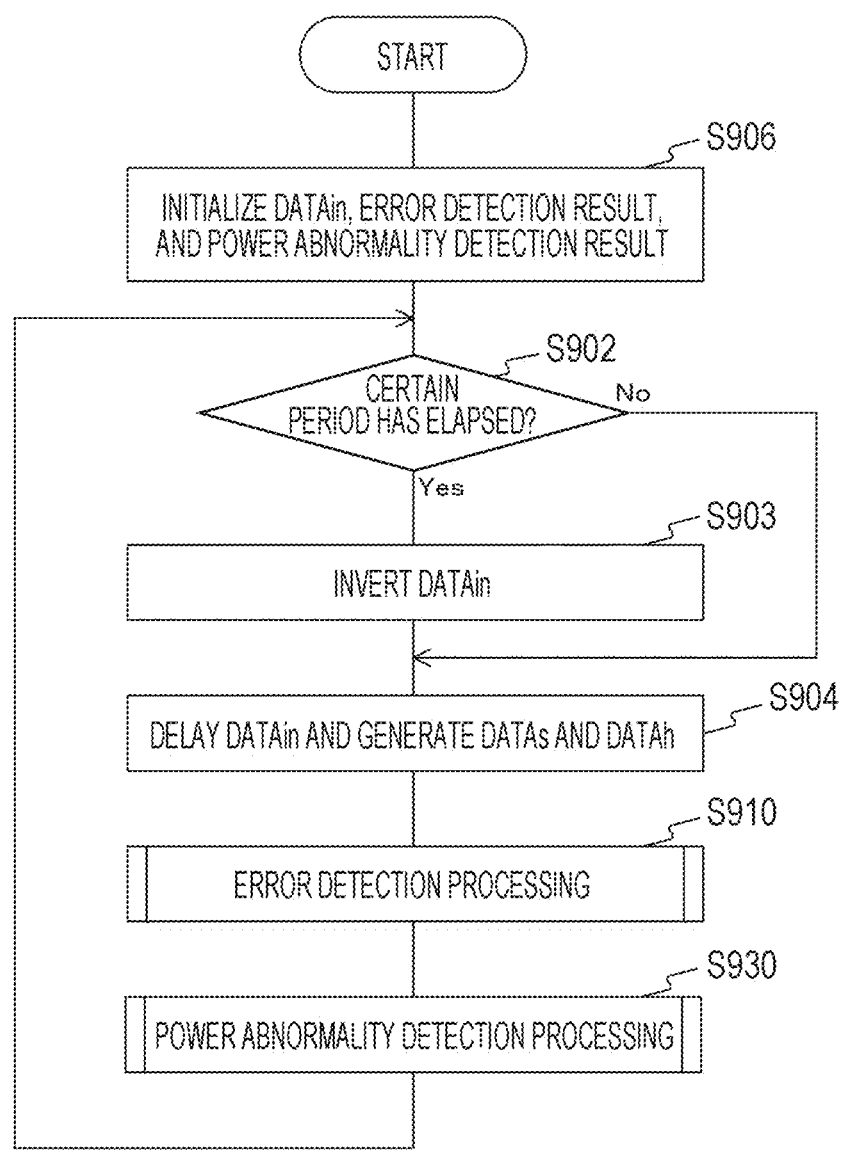
FIG. 22 is a flowchart illustrating exemplary operations of the abnormality detection part according to the fourth embodiment of the present technology.

FIG. 22 is a flowchart illustrating exemplary operations of the abnormality detection part 200 according to the fourth embodiment of the present technology. The operations of the abnormality detection part 200 according to the fourth embodiment are different from those according to the first embodiment in that step S906 is performed instead of step S901 and step S930 is further performed.

The power abnormality detection part 290 sets the data signal $DATA_{in}$, the error detection result, and the power abnormality detection result at an initial value (such as "0") (step S906). Further, the abnormality detection part 200 performs a power abnormality detection processing (step S930) of detecting the presence of a power abnormality after the error detection processing (step S910). The abnormality detection part 200 repeatedly performs step S902 and its subsequent steps after step S930.

Figure 23:
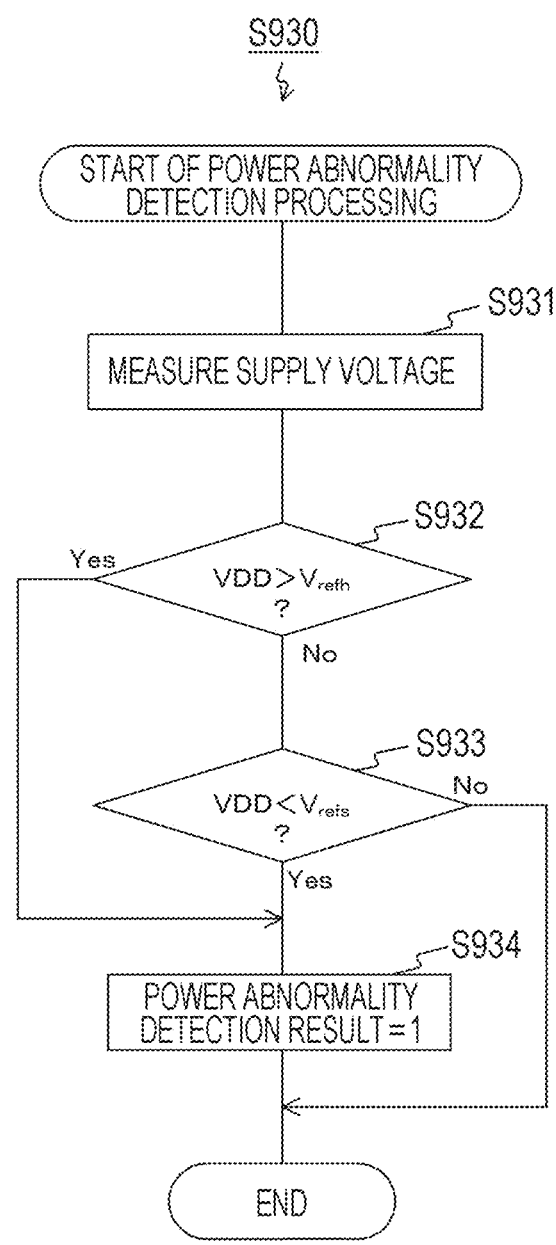
FIG. 23 is a flowchart illustrating an exemplary power abnormality detection processing according to the fourth embodiment of the present technology.

FIG. 23 is a flowchart illustrating an exemplary power abnormality detection processing according to the fourth embodiment of the present technology. The power abnormality detection part 290 measures the supply voltage VDD (step S931), and determines whether or not the supply voltage VDD is higher than the reference voltage $V_{refh}$ (step S932). In a case where the supply voltage VDD is the reference voltage $V_{refh}$ or less (step S932: No), the power abnormality detection part 290 determines whether or not the supply voltage VDD is lower than the reference voltage $V_{refs}$ (step S933).

In a case where the supply voltage VDD is higher than the reference voltage $V_{refh}$ (step S932: Yes) or in a case where the supply voltage VDD is lower than the reference voltage $V_{refs}$ (step S933: Yes), the power abnormality detection part 290 sets the power abnormality detection result at "1" (step S934). In a case where the supply voltage VDD is the reference voltage $V_{refs}$ or more (step S933: No) or after step S934, the power abnormality detection part 290 terminates the power abnormality detection processing.

In this way, according to the fourth embodiment of the present technology, the abnormality processing part 150 controls the power supply circuit 140 or the clock supply part 110 when a mismatch between the delay signal and the expected value is detected, thereby preventing a timing error due to a power abnormality or a clock abnormality from being caused.

Variant

According to the fourth embodiment described above, the power abnormality detection part 290 detects the occurrence of a power abnormality in a case where the supply voltage VDD outside the range between the reference voltages $V_{refs}$ and $V_{refh}$ is measured. However, the power abnormality detection part 290 may erroneously detect the occurrence of a power abnormality due to power-supply noise although the power abnormality is not caused. The power abnormality detection part 290 according to a variant of the fourth embodiment is different from that according to the fourth embodiment in that erroneous detection due to power-supply noise is reduced.

Figure 24:
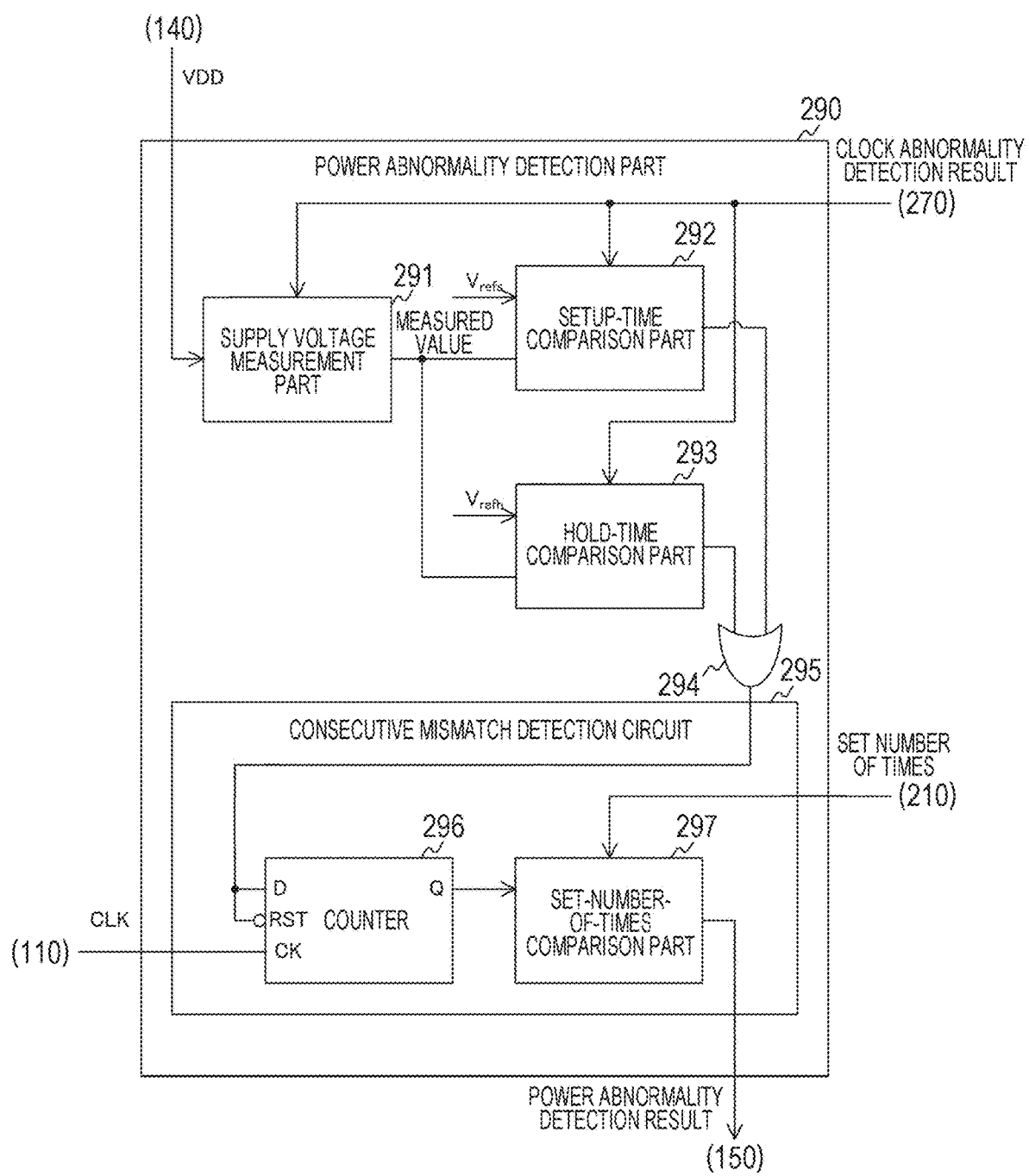
FIG. 24 is a block diagram illustrating an exemplary configuration of the power abnormality detection part according to a variant of the fourth embodiment of the present technology.

FIG. 24 is a block diagram illustrating an exemplary configuration of the power abnormality detection part 290 according to the variant of the fourth embodiment of the present technology. The power abnormality detection part 290 according to the variant of the fourth embodiment is different from that according to the fourth embodiment in that it further includes a consecutive mismatch detection circuit 295. The consecutive mismatch detection circuit 295 includes a counter 296 and a set-number-of-times comparison part 297.

The counter 296 is directed to counting the number of times an output signal of the OR gate 294 consecutively enters high level (the supply voltage VDD is outside the predetermined range) in synchronization with the clock signal CLK. The counter 296 supplies the counted value to the set-number-of-times comparison part 297.

The set-number-of-times comparison part 297 is directed to comparing the counted value of the counter 296 with the set number of times. The set number of times is set by the control part 210, for example. The set-number-of-times comparison part 297 detects the occurrence of a power abnormality in a case where the counted value is higher than the set number of times.

In this way, according to the variant of the fourth embodiment of the present technology, the set-number-of-times comparison part 297 determines that the power is abnormal when the number of times the supply voltage VDD is consecutively determined as outside the predetermined range is larger than the set number of times, thereby preventing erroneous detection due to power-supply noise.

Additionally, the aforementioned embodiments are demonstrated as examples for implementing the present technology, and the items according to the embodiments and the invention-specific items in CLAIMS have a correspondence relationship. Similarly, the invention-specific items in CLAIMS and the items according to the embodiments of the present technology denoted with the same names as the invention-specific items have a correspondence relationship. However, the present technology is not limited to the embodiments, and the embodiments are variously modified without departing from the spirit thereby to implement the present technology.

Further, the processing procedures described in the aforementioned embodiments may be regarded as a method having the procedures, or may be regarded as a program for causing a computer to perform the procedures or a recording medium storing the program therein. The recording medium may employ compact disc (CD), minidisc (MD), digital versatile disc (DVD), memory card, Blu-ray (registered trademark) disc, and the like, for example.

Additionally, the effects described in the present specification are merely exemplary and are not restrictive, and other effects may be obtained.

Additionally, the present technology can take the following configurations.

(1) A semiconductor integrated circuit including:
a delay part configured to delay a data signal by two mutually-different delay times and to output it as first and second delay signals;

a holding part configured to hold the first and second delay signals in synchronization with a timing signal for giving an instruction on a predetermined capture timing;

a setup time detection part configured to detect whether or not one of the first and second delay signals held within a setup-time detection period from a predetermined start timing to the predetermined capture timing has changed; and a hold time detection part configured to detect whether or not the other of the first and second delay signals held within a hold-time detection period from the predetermined capture timing to a predetermined end timing has changed.

(2) The semiconductor integrated circuit according to (1), in which the setup time detection part detects whether or not the one has changed depending on whether or not a first expected value matches with the one in a setup-time detection window corresponding to the setup-time detection period, and the hold time detection part detects whether or not the other has changed depending on whether or not a second expected value different from the first expected value matches with the other in a hold-time detection window corresponding to the hold-time detection period.

(3) The semiconductor integrated circuit according to (2), in which the delay part includes:

a first delay part configured to delay the data signal by the first delay time and to output it as the first delay signal; and a second delay part configured to delay the data signal by the second delay time and to output it as the second delay signal.

(4) The semiconductor integrated circuit according to (2), further including:

a setup time error output part configured to output a setup time error in a case where the number of times the first comparison value does not match with the one exceeds a predetermined number of times; and a hold time error output part configured to output a hold time error in a case where the number of times the second comparison value does not match with the one exceeds a predetermined number of times.

(5) The semiconductor integrated circuit according to (2), further including:

a setup-time alarm output part configured to output a setup-time alarm in a case where the number of times the first comparison value does not match with the one exceeds a predetermined number of times; and a hold-time alarm output part configured to output a hold-time alarm in a case where the number of times the second comparison value does not match with the one exceeds a predetermined number of times.

(6) The semiconductor integrated circuit according to (2), further including:

a control part configured to sequentially perform a processing of selecting a time in a first range as the first delay time and setting it in the delay part and a processing of selecting a time in a second range different from the first range as the second delay time and setting it in the delay part.

(7) The semiconductor integrated circuit according to (6), further including:

a setup time error output part configured to output a setup time error in a case where the first delay time in which a mismatch between the first comparison value and the one is detected is shorter than a first set time; and a hold time error output part configured to output a hold time error in a case where the second delay time in which a mismatch between the second comparison value and the one is detected is longer than a second set time.

(8) The semiconductor integrated circuit according to (6), further including:

a setup-time alarm output part configured to output a setup-time alarm in a case where the first delay time in which a mismatch between the first comparison value and the one is detected is shorter than a first set time; and a hold-time alarm output part configured to output a hold-time alarm in a case where the second delay time in which a mismatch between the second comparison value and the one is detected is longer than a second set time.

(9) The semiconductor integrated circuit according to any of (1) to (8), further including:

an abnormality determination part configured to, in a case where a change in either of the first and second delay signals is detected, determine which of power and the timing signal is abnormal on the basis of the detection result.

(10) The semiconductor integrated circuit according to (9), in which the abnormality determination part determines which of a power abnormality due to an increase in supply voltage and a power abnormality due to a decrease in the supply voltage is caused on the basis of the first and second delay times.

(11) The semiconductor integrated circuit according to (9) or (10), in which the abnormality determination part determines which of an abnormality due to an increase in speed of the timing signal and an abnormality due to a decrease in speed of the timing signal is caused on the basis of the first and second delay times.

(12) The semiconductor integrated circuit according to any of (1) to (11), further including:

a power abnormality detection part configured to detect whether or not a power abnormality is caused depending on whether or not a supply voltage is within a predetermined range in a case where a change in either of the first and second delay signals is detected.

(13) The semiconductor integrated circuit according to (12), in which the power abnormality detection part determines whether or not the supply voltage is within the predetermined range in a case where a change in either of the first and second delay signals is detected, and detects whether or not the power abnormality is caused depending on whether or not the number of times the supply voltage is determined as not in the predetermined range exceeds a predetermined number of times.

(14) A method for controlling a semiconductor integrated circuit including:

a delay procedure of delaying a data signal by two mutually-different delay times and outputting it as first and second delay signals;

a holding procedure of holding the first and second delay signals in synchronization with a timing signal for giving an instruction on a predetermined capture timing;

a setup time detection procedure of detecting whether or not one of the first and second delay signals held within a setup-time detection period from a predetermined start timing to the predetermined capture timing has changed; and a hold time detection procedure of detecting whether or not the other of the first and second delay signals held within a hold-time detection period from the predetermined capture timing to a predetermined end timing has changed.

REFERENCE SIGNS LIST

100 Semiconductor integrated circuit
110 Clock supply part

120 Logic circuit
130 Output mask circuit
140 Power supply circuit
150 Abnormality processing part
200 Abnormality detection part
210 Control part
215 Delay time set range holding part
221, 222, 241, 242, 254, 264 Flip-flop
231 Setup-time critical path
232, 234, 236 Delay device
233 Hold-time critical path
235 Variable critical path
237 Selector
250 Setup-time mismatch detection part
251, 261 Negative OR (NOR) gate
253, 263 Inverter
252, 262 Logical conjunction (AND) gate
260 Hold-time mismatch detection part
270 Error output part
271 Setup time error output part
272, 275, 296 Counter
273, 276, 297 Set-number-of-times comparison part
274 Hold time error output part
277, 287, 294 Logical add (OR) gate
280 Alarm output part
281 Setup-time alarm output part
282, 285 Mismatch-detected delay stage measurement part
283, 286 Set-number-of-times/number-of-consecutive-times comparison part
284 Hold-time alarm output part
288 Alarm type determination part
290 Power abnormality detection part
291 Supply voltage measurement part
292 Setup-time comparison part
293 Hold-time comparison part
295 Consecutive mismatch detection circuit

The invention claimed is:

1. A semiconductor integrated circuit comprising:
a delay part configured to delay a data signal by two mutually-different delay times and to output it as first and second delay signals;
a holding part configured to hold the first and second delay signals in synchronization with a timing signal forgiving an instruction on a predetermined capture timing;
a setup time detection part configured to detect whether or not one of the first and second delay signals held within a setup-time detection period from a predetermined start timing to the predetermined capture timing has changed; and
a hold time detection part configured to detect whether or not the other of the first and second delay signals held within a hold-time detection period from the predetermined capture timing to a predetermined end timing has changed.

2. The semiconductor integrated circuit according to claim 1,
wherein the setup time detection part detects whether or not the one has changed depending on whether or not a first expected value matches with the one in a setup-time detection window corresponding to the setup-time detection period, and
the hold time detection part detects whether or not the other has changed depending on whether or not a second expected value different from the first expected value matches with the other in a hold-time detection window corresponding to the hold-time detection period.

3. The semiconductor integrated circuit according to claim 2,
wherein the delay part comprises:
a first delay part configured to delay the data signal by the first delay time and to output it as the first delay signal; and
a second delay part configured to delay the data signal by the second delay time and to output it as the second delay signal.

4. The semiconductor integrated circuit according to claim 2, further comprising:
a setup time error output part configured to output a setup time error in a case where the number of times the first comparison value does not match with the one exceeds a predetermined number of times; and
a hold time error output part configured to output a hold time error in a case where the number of times the second comparison value does not match with the one exceeds a predetermined number of times.

5. The semiconductor integrated circuit according to claim 2, further comprising:
a setup-time alarm output part configured to output a setup-time alarm in a case where the number of times the first comparison value does not match with the one exceeds a predetermined number of times; and
a hold-time alarm output part configured to output a hold-time alarm in a case where the number of times the second comparison value does not match with the one exceeds a predetermined number of times.

6. The semiconductor integrated circuit according to claim 2, further comprising:
a control part configured to sequentially perform a processing of selecting a time in a first range as the first delay time and setting it in the delay part and a processing of selecting a time in a second range different from the first range as the second delay time and setting it in the delay part.

7. The semiconductor integrated circuit according to claim 6, further comprising:
a setup time error output part configured to output a setup time error in a case where the first delay time in which a mismatch between the first comparison value and the one is detected is shorter than a first set time; and
a hold time error output part configured to output a hold time error in a case where the second delay time in which a mismatch between the second comparison value and the one is detected is longer than a second set time.

8. The semiconductor integrated circuit according to claim 6, further comprising:
a setup-time alarm output part configured to output a setup-time alarm in a case where the first delay time in which a mismatch between the first comparison value and the one is detected is shorter than a first set time; and
a hold-time alarm output part configured to output a hold-time alarm in a case where the second delay time in which a mismatch between the second comparison value and the one is detected is longer than a second set time.

9. The semiconductor integrated circuit according to claim 1, further comprising:
an abnormality determination part configured to, in a case where a change in either of the first and second delay signals is detected, determine which of power and the timing signal is abnormal on a basis of the detection result.

10. The semiconductor integrated circuit according to claim 9,
wherein the abnormality determination part determines which of a power abnormality due to an increase in supply voltage and a power abnormality due to a decrease in the supply voltage is caused on a basis of the first and second delay times.

11. The semiconductor integrated circuit according to claim 9,
wherein the abnormality determination part determines which of an abnormality due to an increase in speed of the timing signal and an abnormality due to a decrease in speed of the timing signal is caused on a basis of the first and second delay times.

12. The semiconductor integrated circuit according to claim 1, further comprising:
a power abnormality detection part configured to detect whether or not a power abnormality is caused depending on whether or not a supply voltage is within a predetermined range in a case where a change in either of the first and second delay signals is detected.

13. The semiconductor integrated circuit according to claim 12,
wherein the power abnormality detection part determines whether or not the supply voltage is within the predetermined range in a case where a change in either of the first and second delay signals is detected, and detects whether or not the power abnormality is caused depending on whether or not the number of times the supply voltage is determined as not in the predetermined range exceeds a predetermined number of times.

14. A method for controlling a semiconductor integrated circuit comprising:
a delay procedure of delaying a data signal by two mutually-different delay times and outputting it as first and second delay signals;
a holding procedure of holding the first and second delay signals in synchronization with a timing signal for giving an instruction on a predetermined capture timing;
a setup time detection procedure of detecting whether or not one of the first and second delay signals held within a setup-time detection period from a predetermined start timing to the predetermined capture timing has changed; and
a hold time detection procedure of detecting whether or not the other of the first and second delay signals held within a hold-time detection period from the predetermined capture timing to a predetermined end timing has changed.

* * * * *